(12) United States Patent
Sano

(10) Patent No.: US 6,218,703 B1
(45) Date of Patent: *Apr. 17, 2001

(54) SEMICONDUCTOR DEVICE WITH CONTROL ELECTRODES FORMED FROM SEMICONDUCTOR MATERIAL

(75) Inventor: Yutaka Sano, Hayama-machi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/414,266

(22) Filed: Oct. 7, 1999

Related U.S. Application Data

(62) Division of application No. 08/685,203, filed on Jul. 23, 1995, now Pat. No. 5,998,842.

(30) Foreign Application Priority Data

Jul. 24, 1995 (JP) .................................................. 7-208380

(51) Int. Cl.⁷ .................................................. H01L 29/00
(52) U.S. Cl. .......................... 257/347; 257/316; 257/338; 257/351; 257/369; 257/357
(58) Field of Search ................................... 357/316, 338, 357/351, 369, 347, 357

(56) References Cited

U.S. PATENT DOCUMENTS

| | | |
|---|---|---|
| 4,472,821 | 9/1984 | Mazin et al. . |
| 4,477,883 | 10/1984 | Wada . |
| 4,862,241 | 8/1989 | Ashida et al. . |
| 5,446,299 * | 8/1995 | Acovic et al. ........................ 257/316 |
| 5,998,842 * | 12/1999 | Sano ..................................... 257/366 |

FOREIGN PATENT DOCUMENTS

| | | |
|---|---|---|
| 3297170 | 12/1991 | (JP) . |
| 6151852 | 5/1994 | (JP) . |

* cited by examiner

*Primary Examiner*—Fetsum Abraham
(74) *Attorney, Agent, or Firm*—Cooper & Dunham LLP

(57) ABSTRACT

A MOS semiconductor device with control electrodes for improved switching accuracy and operational speeds of the device at reduced power consumption levels. The semiconductor device includes a substrate, a source electrode region and a drain electrode region formed in said substrate, a first gate insulating film formed on said substrate, a semiconductor region formed on said first gate insulating film, a second gate insulating film formed on said semiconductor region, a gate electrode region formed on said second gate insulating film, and at least one control electrode region disposed in contact with said semiconductor region.

3 Claims, 27 Drawing Sheets

SEMICONDUCTOR DEVICE WITH CONTROL ELECTRODES FORMED FROM SEMICONDUCTOR MATERIAL

This is a divisional of application Ser. No. 08/685,203 filed Jul. 23, 1996.

BACKGROUND OF THE INVENTION

1. Field of Invention

The present invention relates to semiconductor devices with improved switching accuracy and operational speeds at reduced power consumption levels. More particularly, the present invention relates to MOS semiconductor devices and circuits having control electrodes that improve the switching accuracy and speed of the devices and circuits while reducing the power consumption thereof, and while permitting fabrication using standard MOS fabrication techniques and equipment.

2. Description of the Related Art

In recent years, large scale integration technology has steadily improved so that more complex integrated circuits can be fabricated. However, limitations in current VLSI technology preclude reliable use of such technology in high speed circuit applications. Attempts to overcome these limitations have involved the controlling of the switching threshold voltage and resulted in the use of functional semiconductor devices such as neuron MOS (vMOS) transistors and circuits (e.g., EEPROMs) fabricated using conventional silicon process technology. The vMOS transistor is a MOS transistor having a feature wherein a single vMOS element has capabilities similar to that of a neuron. FIG. 24 illustrates a vMOS transistor structure. The vMOS transistor includes a source electrode region 55 and a drain electrode region 56 formed by doping an impurity into a semiconductor substrate 57 to a high-concentration level. A gate insulating film 50, a floating gate 48, and a gate insulating film 51 are formed successively on the semiconductor substrate 57, and a plurality of signal input gates 45 and 46 are formed on the gate insulating film 51. The floating gate 48 is surrounded by the gate insulating films 50 and 51, and the signal input gates 45 and 46 are capacitively coupled with the floating gate 48. The gate voltage of the floating gate 48 is given as a weighted linear addition of the signal voltages applied to the signal input gates 45 and 46. The signal input gate 45 is capacitively coupled with the floating gate 48 via a capacitor C, created across the gate insulating film 51, and the signal input gate 46 is capacitively coupled with the floating gate 48 via a capacitor C2 created across gate insulating film 51. If the voltages applied to the signal input gates 45 and 46 are represented by $V_{g1}$ and $V_{g2}$, respectively, the voltage ($\phi_F$) on the floating gate 48 can be written as $\phi_F=(C_1V_{g1}+C_2V_{g2})/(C_1+C_2)$. If the floating gate voltage $\phi_F$ is lower than a threshold voltage $V_{th}$, the transistor is in an off-state, and if the floating gate voltage $\phi_F$ is greater than the threshold voltage $V_{th}$ the transistor is in an on-state. In FIG. 28, $V_{sub}$, $V_s$, $V_d$ denote a substrate voltage, source voltage, and drain voltage, respectively.

FIG. 25 represents a circuit diagram of a 2-input vMOS transistor having a structure similar to that shown in FIG. 24, and FIG. 26 illustrates a graph of drain current vs. gate voltage for the 2-input vMOS transistor shown in FIG. 25. For simplicity, it is assumed here that the capacitance of both $C_1$ and $C_2$ are 1 (unity). In this case, when $(V_{g1}+V_{g2})/2>V_{th}$, a current flows through the channel of the 2-input vMOS transistor. Therefore, if $V_{g1}$ and $V_{g2}$ are regarded as an input voltage and a control voltage, respectively, then the threshold voltage of the transistor seen by $V_{g1}$ is controlled by $V_{g2}$. Although, the overall gate voltage required for the channel to be turned on is constant, the apparent threshold voltage seen at a signal input gate is changed by the voltage applied to the other signal input gate. Thus, the vMOS structure shown in FIG. 24 can function as a variable threshold device. Discussions of current vMOS transistor technology can be found in "Nikkei Micro Devices" pp.101–109 (January 1992) and in a paper published in "Technical Report", The Institute of Electronics, Information, and Communications Engineers, ICD93-6, by Shibata and Omi, pp.39–46.

The vMOS transistor structure can be used to construct semiconductor circuits having CMOS characteristics. FIGS. 27a and 27b illustrate a functional layout of a semiconductor inverter having input gates 61, a floating gate 62 and gate oxide films 63 and 64 that is fabricated using vMOS transistors and has CMOS operating characteristics. FIG. 28 illustrates a circuit diagram of the CMOS-type inverter seen in FIGS. 27a and 27b.

The vMOS transistor structure can be used to construct an EEPROM semiconductor circuit. As seen in FIG. 29, the EEPROM includes a source electrode region 58 and a drain electrode region 59 that are formed in a semiconductor substrate 60 by diffusing an impurity to a high-concentration level. A gate insulating film 52, a floating gate 49, and a gate insulating film 53 are successively formed on the semiconductor substrate 60, and a control gate 47 is formed on the gate insulating film 53. The floating gate 49 is surrounded by the gate insulating films 52 and 53, and the control gate 47 is capacitively coupled with the floating gate. The gate insulating film 52 has a portion 54 with a very thin thickness. Under a certain bias condition, the thin portion 54 acts as a tunnel oxide film so that a tunnel current flows between the drain electrode region 59 and the floating gate 49 through the thin portion 54 acting as a tunnel oxide film. FIG. 30 illustrates a circuit diagram of the EEPROM shown in FIG. 29. The floating gate 49 can be at either one of two different voltage levels depending on whether a charge is injected, through the tunneling effect, from the drain 59 into the floating gate 49 through the tunnel oxide film 54. The difference in the floating gate voltage results in a difference in the threshold voltage seen by the control gate 47. As a result, the voltage required for the control gate 47 to turn on the device so that a sufficiently large current flows through a surface region of the semiconductor substrate 60 between the source 58 and the drain 59, can have either one of two different values.

Although the above described vMOS transistor is fabricated with substantially the same structure as conventional MOS devices in terms of the source electrode regions, the drain electrode regions, and the silicon substrates, the vMOS transistor differs from conventional MOS transistors in that their threshold voltages can be varied. The vMOS transistor can be used in the fabrication of various semiconductor circuits including memory circuits that have advantages over conventional MOS circuits. For example, such semiconductor circuits are fabricated from vMOS transistors having similar operating characteristics as CMOS circuits, and such semiconductor circuits can be fabricated using a substantially smaller number of vMOS transistors as compared to conventional MOS circuits.

However, one limitation of such vMOS based semiconductor circuits is that the threshold voltages of the vMOS transistors are determined by the capacitance between the floating gate and a plurality of input gates. As a result, the threshold voltage of each transistor is influenced by the dimensions (e.g., the area) of the gate electrode. However, inherent variations in the fabrication processes used to produce such vMOS based semiconductor circuits makes it difficult to adequately control the dimensions of the gate electrode. These inherent variations reduce the switching speed and accuracy of circuits fabricated from vMOS transistors. That is, the operational characteristics of such vMOS based circuits are directly determined by the accuracy of the microstructure fabrication process or microlithography technology. The inherent variations in the fabrication process are magnified with, for example, VLSI circuits where as the complexity of the circuit increases the number of vMOS transistors used also increases.

One reason for the inherent variations is in the fabrication of vMOS transistors. When fabricating vMOS transistors it is necessary to eliminate capacitive coupling between an overlapping portion located between the input and floating gates and the channel region of the vMOS transistor. To eliminate the capacitive coupling a two-dimensional expansion of the vMOS transistor structure is made. As a result, the size of the transistor is increased and the circuits are not suitable for high density integration.

The advancements made in VLSI technology have spurred the evolution of many digital techniques and systems capable of processing analog input signals. The increase in the implementation of digital systems has increased the need for highly accurate analog-to-digital converters that operate at high speeds and that can be fabricated using existing equipment and processes. For example, the performance of digital video equipment and measuring instruments is often limited by the performance of the A/D converter employed. Flash A/D converters were developed for use in high-speed A/D conversion applications.

FIG. 31 illustrates a circuit configuration for a conventional n-bit flash A/D converter. In this conventional n-bit flash A/D converter, an input signal voltage $V_{in}$ is applied in common to a series of $2^n-1$ comparators 84, and $2^n-1$ reference voltages generated by a series of resistors 83 are supplied to the corresponding comparators. Comparators having a reference voltage greater than the input signal voltage $V_{in}$ all provide an output of logic 0 while comparators having a reference voltage smaller than the input signal voltage $V_{in}$ all provide an output of logic 1. The boundary between logic 0 and logic 1 of the outputs of these comparators, typically called a thermometer code since the outputs are similar to the indication of a thermometer, is detected by a differentiating circuit 85. The n-bit outputs are converted by an encoder 86 to an n-bit binary digital signal and output via output terminals $D_n, D_{n-1}, D_{n-2}, \ldots, D_2, D_1$.

The comparators used in conventional flash A/D converters are typically constructed with bipolar transistors. FIG. 32 illustrates a schematic diagram of an example of such a comparator constructed with bipolar technology. Flash A/D converters constructed with bipolar comparators require a greater number of bipolar transistors resulting in significant variations in the operating characteristics between the transistors. A discussion of comparators constructed with bipolar technology can be found in "Linear Circuit Data Book", Japan Texas Instruments Inc., pgs. 8–53, (1989). Due to limitations in fabricating bipolar transistors, it is difficult to reduce the variations in the operating characteristics between the comparators in conventional flash A/D converters. Such variations in the operating characteristics among comparators reduce the switching accuracy and speed of bipolar flash A/D converters. To illustrate, the output code of a comparator array (the thermometer code) ideally consists of a consecutive series of "1s" at lower positions and a consecutive series of "0's" at upper positions, wherein the transition between logic 1 and logic 0 occurs only once at the boundary between the series of "1's" and the series of "0's". In reality, however, when operating at high frequencies the thermometer code can include a plurality of transition points due to jitter arising from the variations in performance among comparators. When a thermometer code having such an error is converted by the encoder to a binary code, the resultant binary code includes coding errors (sometimes called A/D converter glitch). For the above reason as well as others, conventional bipolar A/D converters tend to generate significant errors when operating at high frequencies.

Various attempts have been made to solve the above problem by improving the circuit configuration of the flash A/D converter. FIG. 33 illustrates a multi-step flash A/D converter that uses sample-and-hold circuits so that an analog voltage provided as an input signal is sampled and held by the sample-and-hold circuits and converted in parallel into upper and lower bits. A discussion of the multi-step flash A/D converter can be found in "Analog Techniques For VLSI", by Kusunoki, Iwata and Akasawa p.184 (1989). Another known technique is to add latches to the respective comparators in the above-described multi-step flash A/D converter so that data is temporarily stored in the latches making it possible for each stage of the converter to operate in a pipe-line fashion. This technique is known as a cascade A/D converter.

However, one limitation of these flash A/D converters is that they require complex circuits which are difficult to implement and fabricate on a large scale.

Furthermore, since these flash A/D converters are based on the non-saturation analog circuit technology constructed with bipolar transistors, they have greater power requirements than saturation-type digital circuits such as CMOS based circuits. As a result, heat dissipation becomes a significant problem with such bipolar based converters, and thus the operating characteristics of the A/D converter may vary with changes in the operating temperature.

In the publication entitled "High-Speed A/D Converters: Recent Technology and Future Trends" by Matsuzawa, ICD91-84, pp.21–28 an example of a flash A/D converter using MOS transistors instead of bipolar transistors is discussed. The A/D converter discussed by Matsuzawa is a 2-stage parallel CMOS A/D converter constructed with chopper type comparators composed of MOS transistors. FIG. 34 illustrates such a converter where inverters 87 are of conventional CMOS type.

In the flash A/D converters constructed with bipolar transistors, and the 2-stage parallel A/D converters constructed with CMOS technology discussed above, the circuit complexity, power requirements, heat dissipation factors, and switching accuracy and speed requirements makes it difficult and/or inefficient to fabricate such circuits using large scale integration technology.

SUMMARY

The present invention provides a semiconductor device (e.g. transistor) construction which satisfies the density and size requirements for current integrated circuits. The present invention also provides various semiconductor circuits fabricated using the semiconductor device construction of the present invention. Such semiconductor circuits include inverters, comparators and analog-to-digital converters whose threshold voltage can be controlled.

The present invention provides a semiconductor device including having a semiconductor substrate, a source electrode region and a drain electrode region formed in the semiconductor substrate, a first gate insulating film provided on the semiconductor substrate, a semiconductor region provided on the first gate insulating film, a second gate insulating film provided on the semiconductor region, a gate electrode provided on the second gate insulating film, and a semiconductor electrode region disposed in contact with the semiconductor electrode region. In this configuration, the voltage applied to the semiconductor region and to the gate electrode can be varied independently of each other. As a result, it possible to control the drain saturation current flowing through the surface of the semiconductor substrate between the source electrode region and the drain electrode region, by changing the voltage applied to the semiconductor electrode region independently of the voltage applied to the gate electrode.

BRIEF DESCRIPTION OF THE DRAWINGS

Preferred embodiments of the invention are described hereinbelow with reference to the drawings wherein.

DETAILED DESCRIPTION

Figure 1:
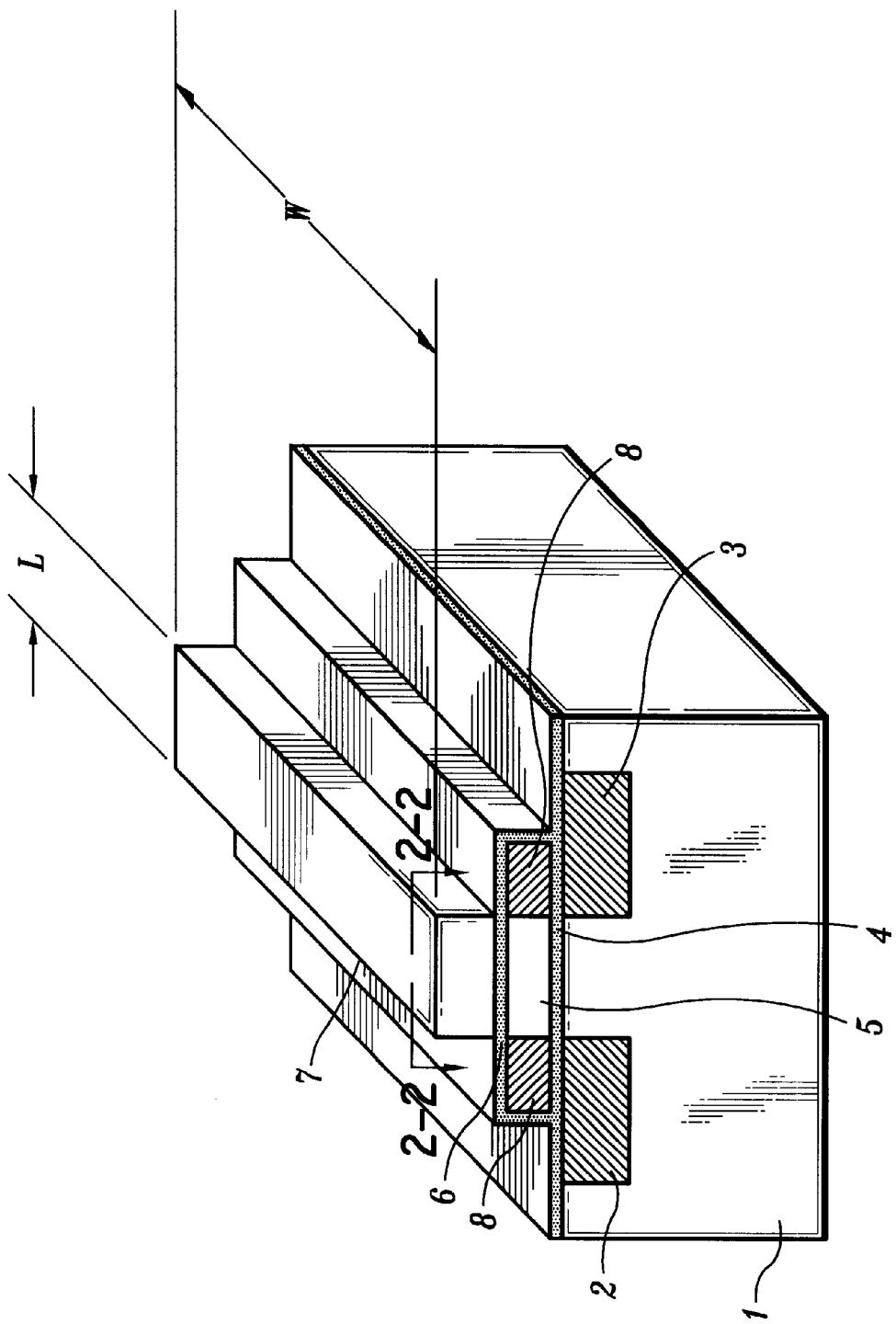
FIG. 1 is a perspective view of a semiconductor device according to the present invention.
Figure 2:
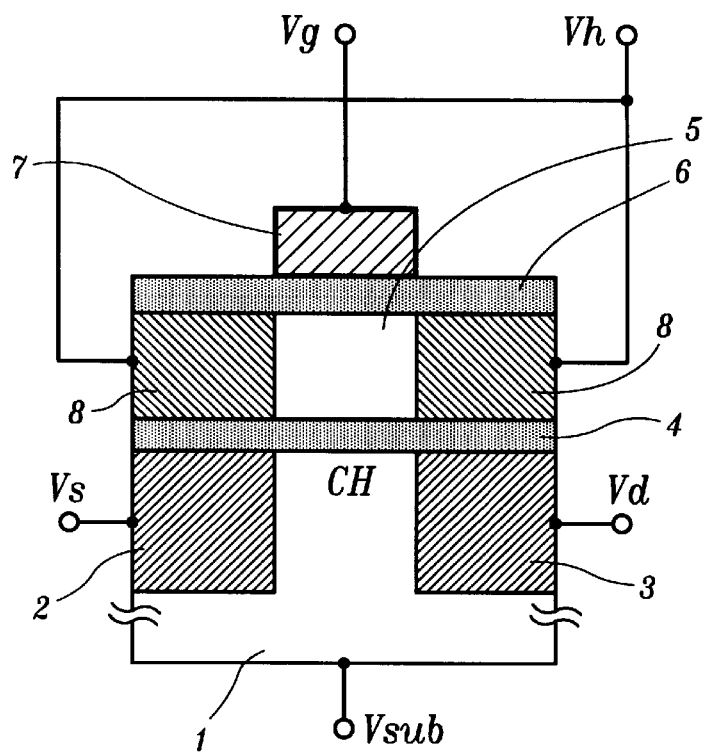
FIG. 2 is a cross-sectional view of the semiconductor device of FIG. 1 taken along line 2—2.
Figure 3:
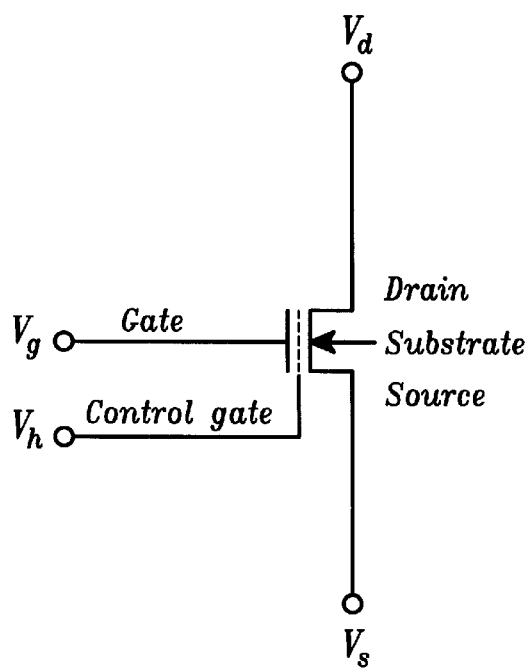
FIG. 3 is a circuit diagram of the semiconductor device shown in FIG. 1.

Referring to FIGS. 1–3 the semiconductor device according to the present invention may be an n-channel type or p-channel type of device that includes a semiconductor substrate 1, a source electrode region 2, and a drain electrode region 3. The source and drain electrode regions 2 and 3 are preferably formed by diffusing impurities into the semiconductor substrate 1 to a high concentration level. A first gate insulating film 4, a semiconductor region 5, and a second gate insulating film 6 are formed on the semiconductor substrate 1. A gate electrode 7 is formed on the second gate insulating film 6. Semiconductor electrode regions 8 are formed in the semiconductor region 5 and are provided as control gate electrodes. The control gate electrode regions 8 have a conduction type which is, for example, the same as that of the source electrode region 2 and the drain electrode region 3 formed in the semiconductor substrate 1. The control gate electrode regions 8 may be formed by the same process for forming the source electrode region 2 and the drain electrode region 3 (diffusion) so that the control gate electrode regions 8 are self-aligned to the source and drain electrode regions 2 and 3, as shown in FIGS. 1 and 2.

A silicon wafer or an SOI (silicon on insulator) wafer may be employed as the semiconductor substrate 1. The semiconductor region 5 is a thin film of polycrystalline silicon. Preferably, the thin film of polycrystalline silicon is crystallized using known processes for converting the film into amorphous form and then performing solid phase growing. The control gate electrode regions 8 are formed by diffusing impurities which provide the same conduction type as that of the source and drain electrode regions 2 and 3, into portions of the semiconductor region 5 to a high concentration level using a self-alignment process.

The operational principles of the semiconductor device shown in FIGS. 1 and 2 will be discussed below. In the semiconductor device shown in FIGS. 1 and 2, the surface region of the semiconductor substrate 1, between the source electrode region 2 and the drain electrode region 3, acts as a channel region CH through which a drain current can flow between the source electrode region 2 and the drain electrode region 3. The magnitude of the drain current changes in response to the voltage applied to the gate control electrode regions 8 disposed in contact with the semiconductor region 5 as well as in response to the voltages applied to the source electrode region 2, the drain electrode region 3, and the gate electrode 7, respectively. As shown in FIG. 3, the source, drain, and gate voltages are denoted by $V_s$, $V_d$, and $V_g$, respectively, and the voltage applied to the control gate electrode regions 8 is denoted by $V_h$. The drain current can be controlled by $V_s$, $V_d$, and $V_g$ but also by $V_h$ In this construction, the semiconductor region 5 is surrounded by the gate insulating films 4 and 6 and the control gate electrode regions 8 so that an external arbitrary voltage can be applied to the semiconductor region. In FIG. 2, $V_{sub}$ denotes a substrate voltage.

Figure 4:
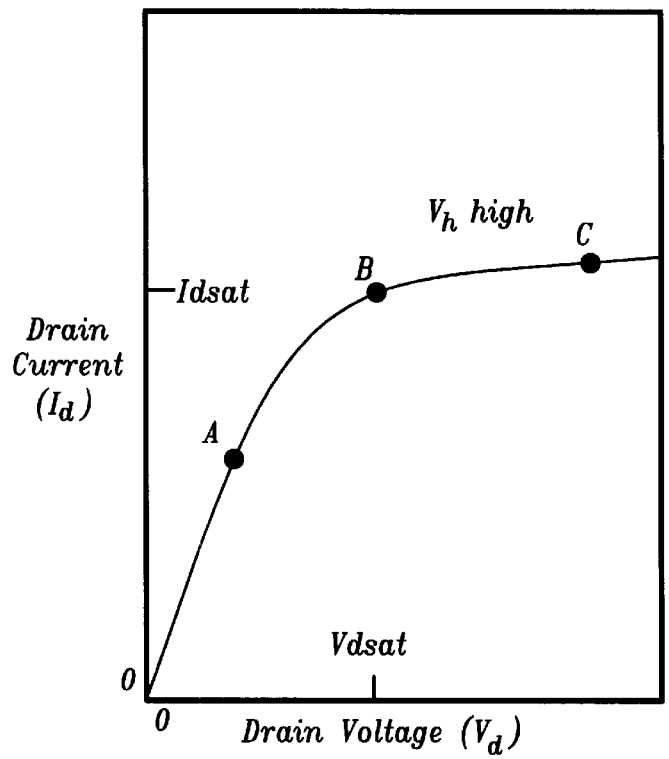
FIG. 4 is a graph of drain current verses drain voltage when a control voltage is greater than a predetermined voltage level during the operation of the semiconductor device of the present invention.

As an illustration, if the semiconductor device seen in FIGS. 1 and 2 is an n-channel type device, and the source electrode region 2 is grounded so that $V_s$=0 volts, applying a gate voltage $V_g$ to the gate electrode 7 would form an inverted layer in the channel region CH in the surface region of the semiconductor substrate 1. In this case, the semiconductor region 5 is fully depleted when the control voltage $V_h$ applied to the control gate electrode regions 8 exceeds a predetermined threshold voltage. FIG. 4 illustrates a relationship between the drain current and the drain voltage under the conditions described above. As can be seen from FIG. 4, when a sufficiently large control voltage $V_h$ is applied to the control gate electrode regions 8, the semiconductor region 5 is fully depleted. If a small drain voltage $V_d$ is applied to the drain electrode, carriers travel from the source region 2 to the drain electrode region 3 through the channel region CH. Thus, in this situation the channel region CH acts as a resistor and a drain current $I_d$ is approximately proportional to the drain voltage $V_d$, as seen at point A in FIG. 4. On the other hand, if the drain voltage $V_d$ increases to a higher level, the depletion layer extends from the drain electrode region 3 and pinch off occurs in the channel region at an end point adjacent to the drain electrode region 3, as seen at point B in FIG. 4. The drain voltage $V_d$ that induces pinch off is referred to as the pinch-off voltage ($V_{dsat}$). If the drain voltage $V_d$ further increases beyond the pinch-off voltage $V_{dsat}$, the drain current $I_d$ saturates and thereafter has a substantially constant value $I_{dsat}$, as seen at point C in FIG. 4.

When a sufficiently large control voltage $V_h$ is applied to the control gate electrode regions 8, the semiconductor region 5 is fully depleted, and the gate insulating film 6 disposed between the gate electrode 7 and the channel region CH has an apparent dielectric constant. The apparent dielectric constant is determined by the dielectric constant of the two gate insulating films 4 and 6, and by the dielectric constant of the semiconductor region 5 disposed between the two gate insulating films 4 and 6. As a result, the semiconductor device according to the present invention has operational characteristics substantially similar to those of conventional MOS transistors in which a gate insulating film having a certain dielectric constant is provided between a gate electrode and a channel region, such that the drain current can be regarded as substantially similar to that of conventional MOS transistors.

Figure 5:
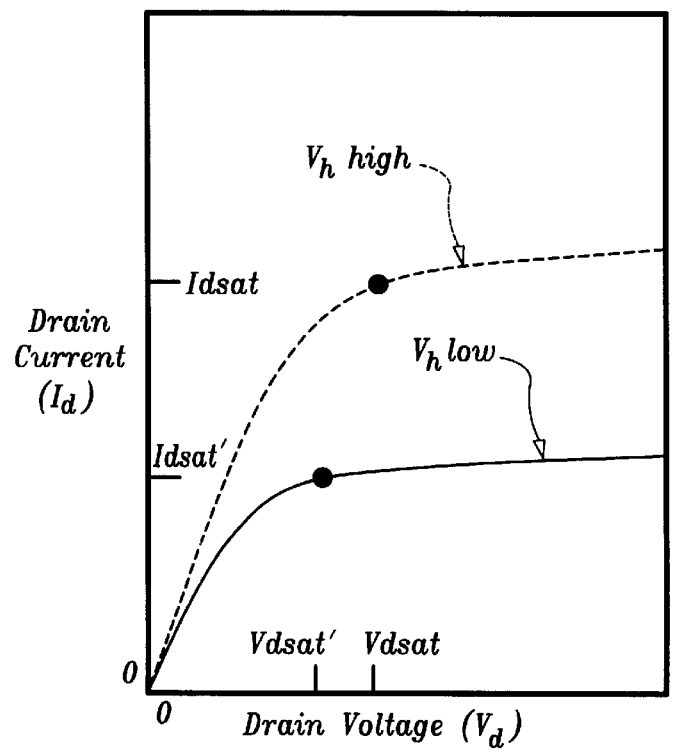
FIG. 5 is a graph of drain current verses drain voltage when the control voltage is less than the predetermined voltage level during the operation of the semiconductor device of the present invention.

When the control voltage $V_h$ applied to the control gate electrode regions 8 is small, the semiconductor region 5 is not fully depleted. FIG. 5 illustrates a comparative relationship between a drain current $I_d$ and a drain voltage $V_d$ when the control voltage $V_h$ is low and when the control voltage is high. As seen in FIG. 5, when the control voltage $V_h$ applied to the control gate electrode regions 8 are low the semiconductor region 5 is not fully depleted and the electric field from the drain electrode region 3 becomes large relative to the electric field from the gate electrode. Conversely, when the control voltage $V_h$ is sufficiently high the semiconductor region 5 is fully depleted. As a result, the pinch-off voltage $V_{dsat'}$ for a small control voltage $V_h$ becomes smaller than the pinch-off voltage $V_{dsat}$ that causes the semiconductor region 5 to be fully depleted. Thus, it is possible to control the drain saturation current $I_{dsat'}$ using the control voltage $V_h$ applied to the control gate electrode 8. Thus, the drain saturation current of the semiconductor device shown in FIGS. 1 and 2 can be variably controlled by controlling the voltage applied to the control gate electrode 8. Therefore, it is possible to control when the drain current $I_d$ flowing through the channel region CH of the substrate saturates by independently changing the control voltage $V_h$ and the gate voltage $V_g$.

Figure 6A:
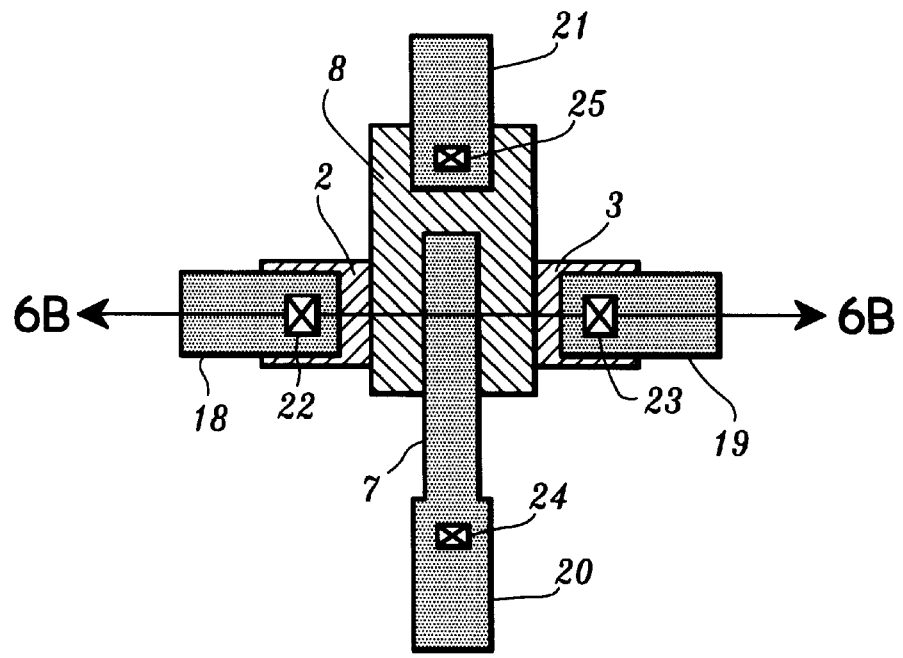
FIGS. 6a and 6b are schematic diagrams of an exemplary semiconductor device fabricated using the semiconductor device structure according to the present invention.
Figure 6B:
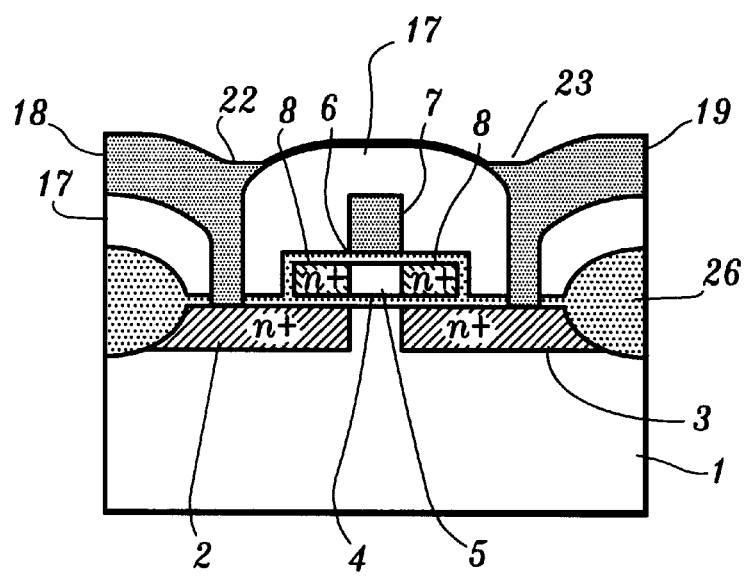
Figure 9:
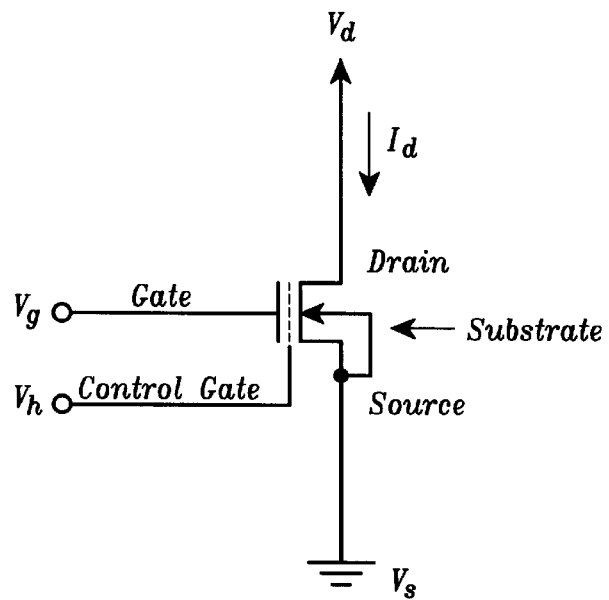
FIG. 9 is a circuit diagram of the semiconductor device shown in FIG. 6.

FIGS. 6a, 6b and 9 illustrate an n-channel type semiconductor device that includes a semiconductor substrate 1 made of a p-type silicon wafer (silicon substrate), a source electrode region 2 and a drain electrode region 3. The source and drain electrode regions 2 and 3 are formed by diffusing an n-type impurity into the silicon wafer 1 to a high-concentration level. A first gate insulating film 4 formed of a silicon oxide film, a semiconductor region 5 formed of a thin film of polycrystalline silicon, and a second gate insulating film 6 formed of a silicon oxide film are successively formed on the silicon wafer 1 between the source electrode region 2 and the drain electrode region 3. The semiconductor device according to the above embodiment also includes a gate electrode 7 of $n^+$-type polysilicon formed on the second gate insulating film 6, and a control gate electrode regions 8 of $n^+$-type polysilicon formed on the semiconductor region 5 of polycrystalline silicon.

Continuing to refer to FIGS. 6a and 6b, the semiconductor device also includes an interlayer insulating film 17, a field oxide film 26, and aluminum interconnections 18–21 connected to the source electrode 2, the drain electrode 3, the gate electrode 7, and the control gate electrode regions 8 via contact holes 22–25, respectively.

Figure 7A:
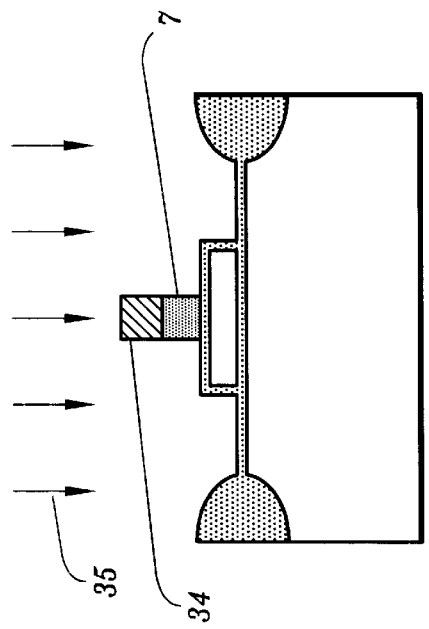
FIGS. 7a–7d is a production flow diagram for fabricating the semiconductor device shown in FIG. 6.

An exemplary production flow diagram of the semiconductor device shown in FIG. 6 will now be described with reference to FIGS. 7a–7d. Referring to FIG. 7a, the field oxide film 26 is formed on a p-type silicon substrate 1 using the LOCOS technique so as to isolate an area on the surface of the substrate 1 and form an active region. A silicon oxide film with a thickness of about 10 nm, serving as the first gate insulating film 4, is formed on the surface of the isolated area of the substrate using a dry oxidation technique performed at a temperature that is preferably lower than 900° C. Once the first gate insulating film 4 is formed, boron ions 29 are doped into the channel region of the semiconductor device through the first gate insulating film 4 to adjust the threshold voltage of the channel region.

Figure 7C:
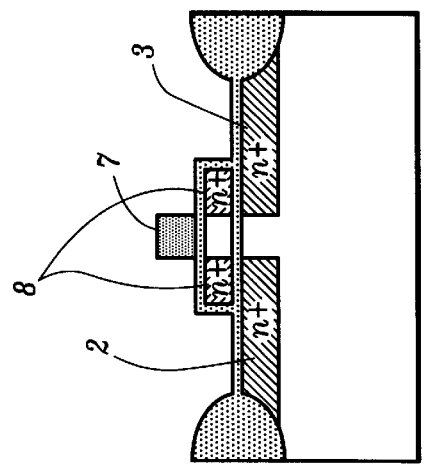
Figure 7B:
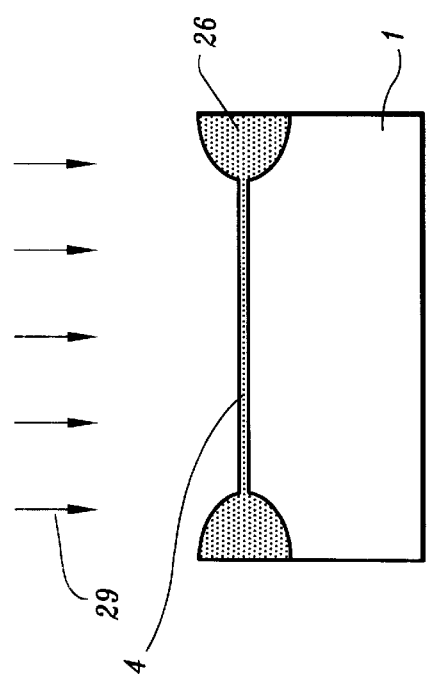

Thereafter, as shown in FIG. 7b, a thin film of polycrystalline silicon having a thickness of about 30 nm, serving as the semiconductor region 5, is formed on the first gate insulating film 4 using low-pressure chemical vapor deposition (LPCVD). The semiconductor region 5 of polycrystalline silicon is then patterned into a predetermined form. Preferably, in the above process the semiconductor region 5 of polycrystalline silicon is formed at, for example, a substrate temperature of about 630° C., at a pressure of about 0.1 Torr, and at a Silane ($SiH_4$) gas flow rate of about 200 SCCM. After the semiconductor region 5 is formed, a silicon oxide film having a thickness of about 10 nm, serving as the second gate insulating film 6, is formed using the LPCVD technique at, for example, a substrate temperature of about 800° C., at a pressure of about 0.9 Torr, at a $SiH_4$ gas flow rate of about 30 SCCM, and at a Nitrous Oxide ($N_2O$) gas flow rate of about 1000 SCCM. Boron ions 32 are then implanted into the semiconductor region 5 of polycrystalline silicon through the second gate insulating film 6 of silicon oxide, so as to adjust the impurity concentration in the semiconductor region 5 of polycrystalline silicon.

Referring now to FIG. 7c, a phosphorus-doped thin polysilicon film having a thickness of about 30 nm is formed using the LPCVD technique. A patterned resist film 34 is formed on the phosphorus-doped thin polysilicon film, and the polysilicon film is patterned into a predetermined form using the resist 34 as a mask to form the gate electrode 7. In the above process, the gate electrode 7 of polysilicon is formed at, for example, a substrate temperature of about 500° C., a pressure of about 0.9 Torr, an Disilane ($Si_2H_6$) gas flow rate of about 90 SCCM, a Phosphine ($PH_3$) gas flow rate of about 10 SCCM, and at an $N_2$ gas flow rate of about 800 SCCM. After the above process, phosphorus ions 35 are implanted using the resist 34 as a mask to form the source electrode region 2, the drain electrode region 3, and the control gate regions 8. The phosphorus ions 35 are preferably implanted using a multiple step ion implantation process where ions are implanted using different implantation energy and dosage levels. For example, a first implantation step may be performed with a $2E15$ $cm^{-2}$ dose of phosphorous ions at 30 keV, and a second implantation step may be performed with a $5E15$ $cm^{-2}$ dose of phosphorous ions at 90 keV. By using the multiple step ion implantation process, the control gate electrode regions 8 are formed by implanting impurity ions at a low energy and the source and drain electrode regions are formed by implanting impurity ions at a high energy. Thus, the multiple step ion implantation process permits simultaneous formation of the source electrode region, the drain electrode region, the gate electrode region, and the control gate electrode regions in a self-alignment fashion.

As seen in FIG. 1, the semiconductor device according to the present invention has a three-dimensional extending structure. To fabricate a device having such a three-dimensional structure, it is desirable to employ a cost effective production process and to reduce the variations in the performance of the semiconductor device. The multiple step ion implantation process permits cost effective fabrication of such semiconductor devices with negligible performance variations, since the three-dimensional structure can be formed in the above described self-alignment fashion.

Figure 7D:
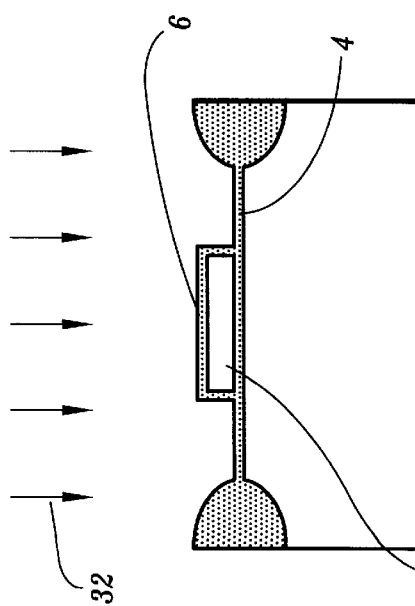

After the multiple step ion implantation process is used to form the source, drain and control gate electrode regions, the implanted impurities are activated using convention activation techniques, such as heating at high temperatures, so that the source electrode region 2, the drain electrode region 3, and the control gate electrode regions 8 are finally formed, as seen in FIG. 7d. Further known processing is performed to form an interlayer insulating film, contact holes, and metal (e.g., aluminum) electrode interconnections to form the n-channel type semiconductor device according to the present invention. Thus, as described above the semiconductor device of the present invention can be fabricated using common silicon fabrication production machinery and processes without having to employ additional costly machinery and processes.

Figure 8:
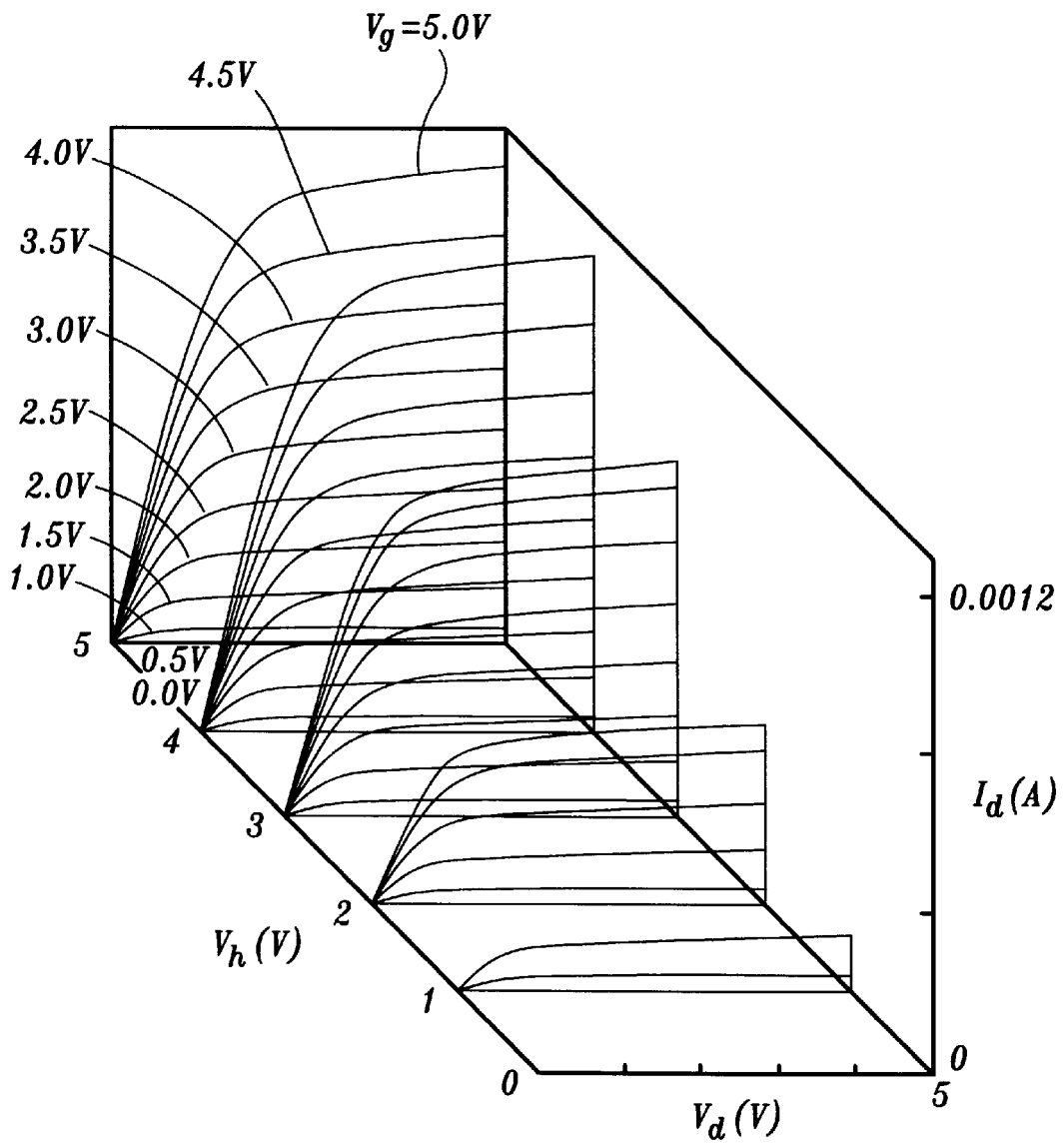
FIG. 8 is a graph illustrating drain current characteristics of the semiconductor device shown in FIG. 6.

FIG. 8 is a graph illustrating drain characteristics of the semiconductor device shown in FIG. 6 when the channel length L is 2 mm, the channel width W is 4 mm, the channel region CH is doped with a $1E16$ $cm^{-3}$ dose of p-type impurity, the semiconductor region 5 is doped with a $1E17$ $cm^{-3}$ dose of p-type impurity, and the gate and control gate electrode regions 7 and 8 respectively are of $n^+$-type polysilicon. The drain characteristics are measured with the source electrode region 2 grounded so that $V_s=0$, and the drain current $I_d$ is measured as a function of the drain voltage $V_d$ while the gate voltage $V_g$ is varied from 0.0 volts to 5.0 volts in 0.5 volt increments, and the control voltage $V_h$ is varied from 0 volt to 5 volts in 1 volt increments. As noted above, the drain saturation current $I_{dsat}$ can be controlled by the control voltage $V_h$.

Although the semiconductor device of the invention described above, is described as an n-channel type device, the semiconductor device of the present invention may also be a p-channel type device. In this case, the device can be fabricated in a manner similar to that of the n-channel device, and the fabricated device operates in a manner similar to the n-channel device. That is, a p-channel device can be produced using fabrication processes similar to those employed for the n-channel device described above.

Figure 10:
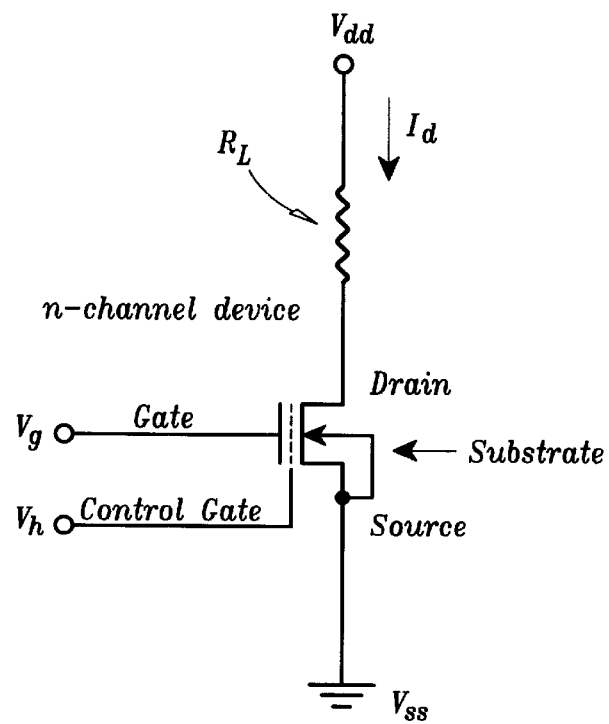
FIG. 10 is a circuit diagram of an inverter constructed with the semiconductor device according to the invention.

The semiconductor devices described above with respect to FIG. 1–9 can be employed to construct various integrated circuits, such as inverters, comparators, and memory circuits. FIG. 10 illustrates a schematic diagram of one embodiment of an inverter circuit fabricated using the semiconductor device of the present invention. The inverter circuit operates in a manner similar to conventional MOSFET inverters with the exception that the logical inverting voltage (i.e., the threshold voltage between logical states) can be controlled by varying the control voltage $V_h$ applied to the control gate electrode regions 8. By changing the control voltage, the drain saturation current $I_{dsat}$ of the inverter can be controlled.

In an alternative embodiment shown in FIGS. 11–14, the inverter circuit may be fabricated using the semiconductor devices in a complementary fashion by forming n-channel and p-channel devices on the semiconductor substrate. The source electrode region, the drain electrode region, and the control gate electrode regions of the n-channel device may be n-type regions, while the source electrode region, the drain electrode region, and the control gate electrode regions of the p-channel device may be p-type regions. The complementary configuration of the n-channel and p-channel devices results in stable operation of the inverter circuit, even at high frequencies, while reducing power consumption.

Figure 11:
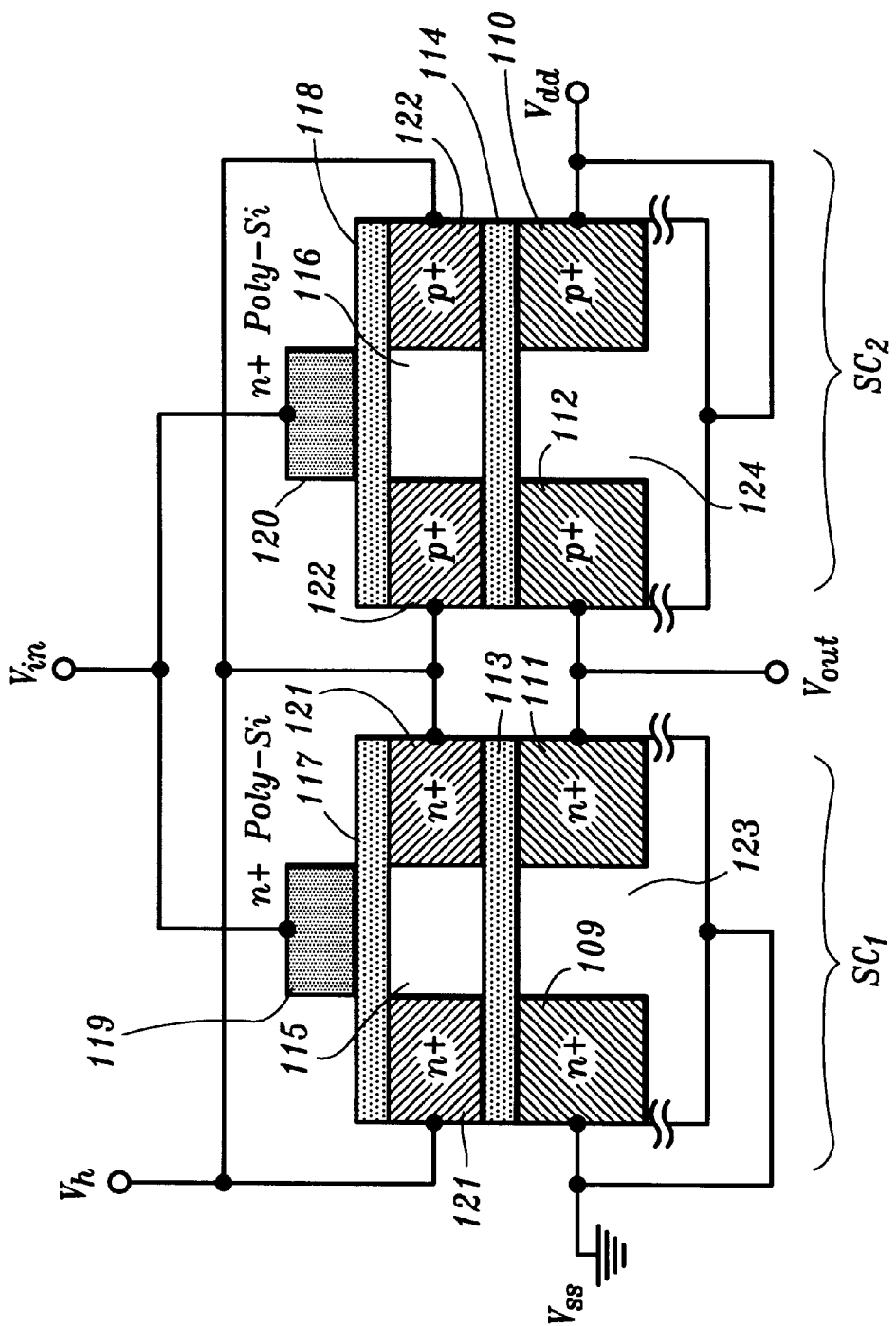
FIG. 11 is a schematic diagram a complementary inverter constructed with a complementary combination of a p-channel semiconductor device and an n-channel semiconductor device.

Referring to FIG. 11, an example of an inverter circuit constructed with the complementary configuration of semiconductor devices is shown. In this embodiment, an n-channel semiconductor device (n-MOS device) SC1 and a p-channel semiconductor device (p-MOS device) SC2 are formed according to the techniques described above to form the complementary inverter circuit. The control gate electrode regions 8 of both devices SC1 and SC2 are connected to each other so that a common control voltage $V_h$ can be applied to the electrode regions.

The operation of the complementary inverter circuit will now be described with reference to FIG. 11, where the n-channel device SC1 is formed on a p-type silicon substrate 123, and the p-channel device SC2 is formed on an n-type silicon substrate 124. In the n-channel device SC1, the source electrode region 109 and the drain electrode region 111 are formed on the silicon substrate 123. A silicon oxide film, serving as the first gate insulating film 113, a thin polycrystalline silicon film, serving as the semiconductor region 115, a silicon oxide film, serving as the second gate insulating film 117, and a polysilicon film serving as the gate electrode 119, are successively formed on the silicon substrate 123, as seen in FIG. 11. Polysilicon electrode regions, serving as the control gate electrode regions 121, are formed at locations in contact with the semiconductor region 115 disposed between the gate insulating films 113 and 117.

In the p-channel device SC2, the source electrode region 110 and the drain electrode region 112 are formed in the silicon substrate 124. A silicon oxide film, serving as the first gate insulating film 114, a thin polycrystalline silicon film, serving as the semiconductor region 116, a silicon oxide film, serving as the second gate insulating film 118, and a polysilicon film, serving as the gate electrode 120, are successively formed on the silicon substrate 124. Polysilicon electrode regions, serving as the control gate electrode regions 122, are formed at locations in contact with the semiconductor region 116 disposed between the gate insulating films 114 and 118.

The drain electrode region 111, gate electrode region 119, and the control gate electrode regions 121 of the n-channel device SC1 are connected to the drain electrode region 112, gate electrode 120, and the control gate electrode regions 122 of the p-channel device SC2, respectively, as seen in FIG. 11. An input voltage $V_{in}$ is applied to the gate electrodes 119 and 120, and an output voltage $V_{out}$ is generated and externally transferred via the drain electrode regions 111 and 112. The source electrode 109 of the n-channel device SC1 is preferably grounded so that the source electrode 109 is maintained at ground potential $V_{ss}$, and a supply voltage $V_{dd}$ is applied to the source electrode 110 of the p-channel device SC2.

Figure 12:
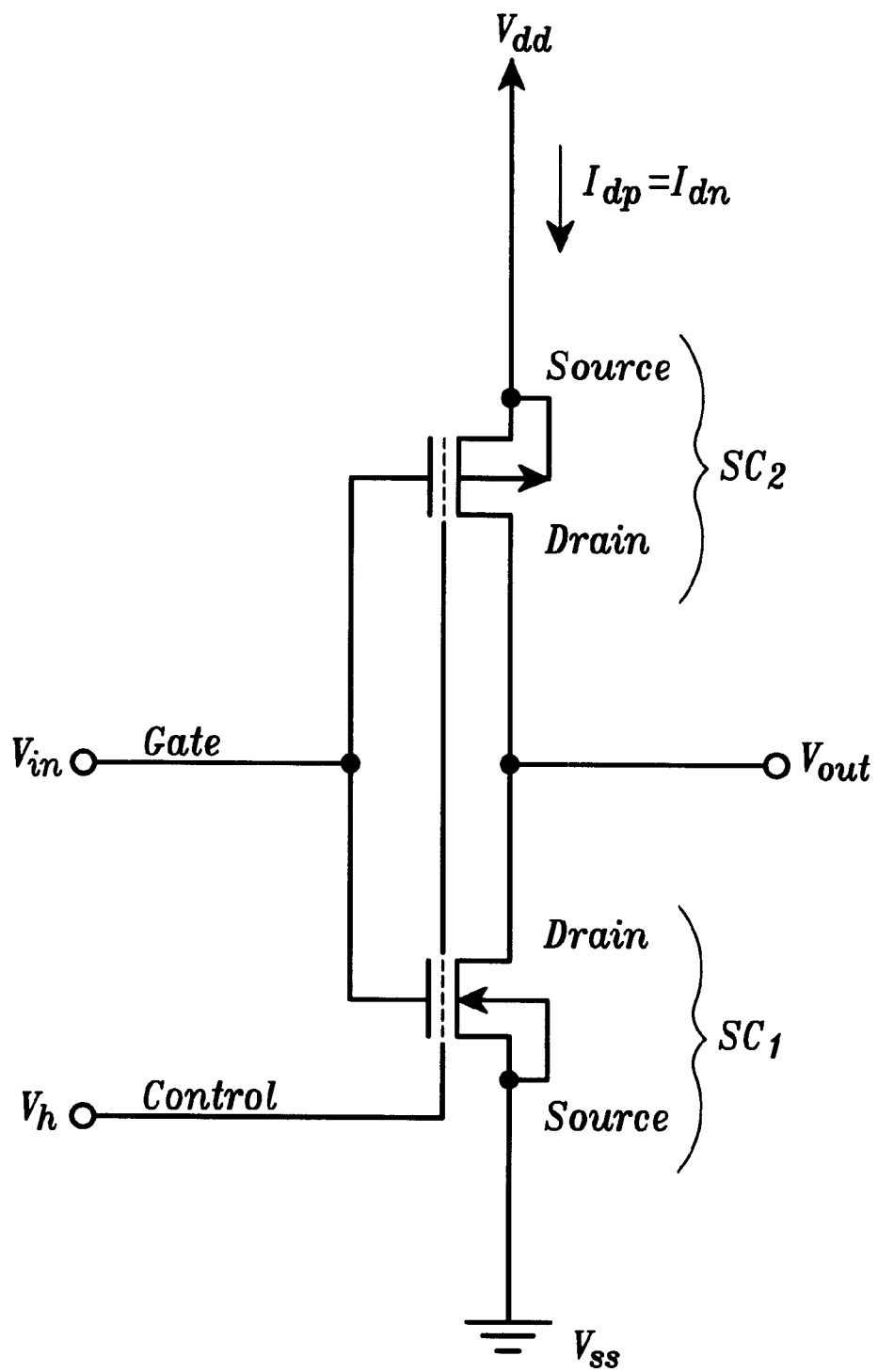
FIG. 12 is a circuit diagram of the complementary inverter shown in FIG. 11.
Figure 13:
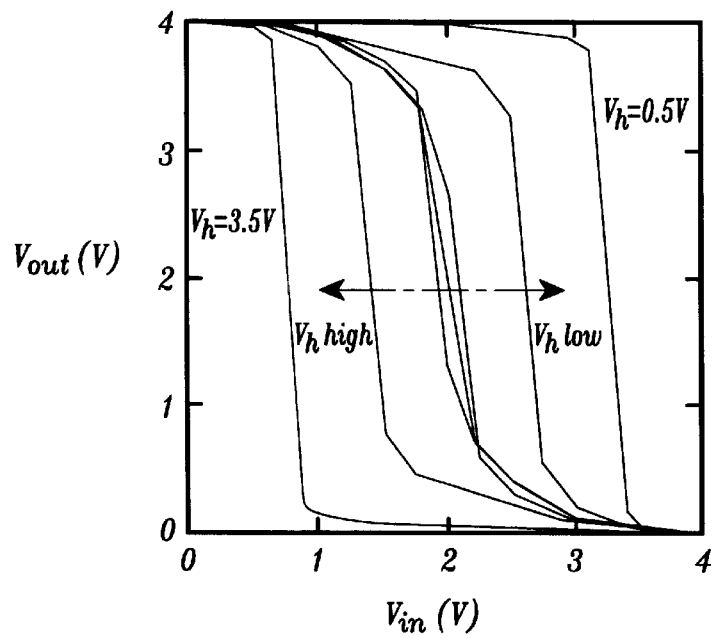
FIG. 13 is a graph of the output voltage verses the input voltage of the inverter shown in FIG. 11.
Figure 14:
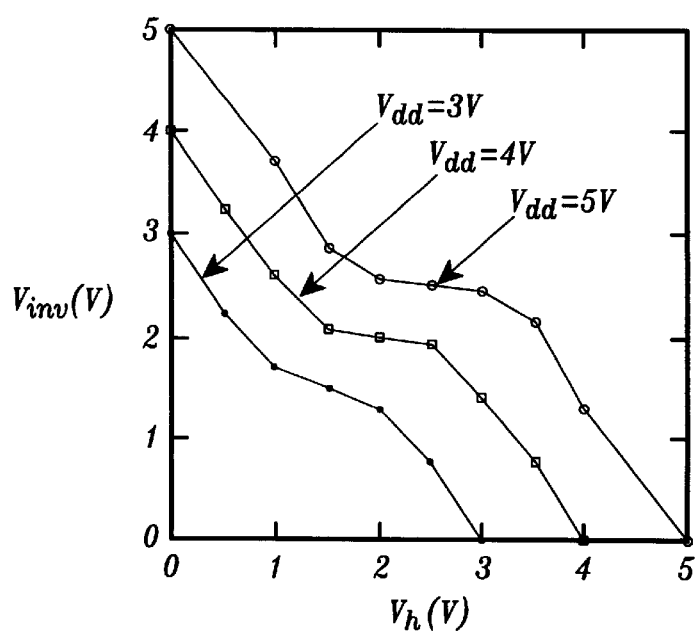
FIG. 14 is a graph illustrating a relationship between a logical inverting voltage and a voltage applied to a control gate of the inverter shown in FIG. 11.

FIG. 12 illustrates a circuit diagram of the complementary inverter circuit constructed with the semiconductor devices according to the present invention, and FIG. 13 illustrates an example of measured input-output characteristics of the complementary inverter circuit obtained by measuring the output voltage $V_{out}$ as a function of the input voltage $V_{in}$ while changing the control voltage $V_h$ from 0.5 volts to 3.5 volts in 0.5 volt increments. As seen in FIG. 13, the logical inverting voltage threshold of the complementary inverter circuit can be controlled by changing the control voltage $V_h$ applied to the control gate electrode regions. FIG. 14 illustrates a measurement result in terms of the relationship between the logical inverting voltage threshold $V_{inv}$ and the control voltage $V_h$ applied to the control gate electrode regions.

In the complementary inverter circuit according to the present invention and shown in FIGS. 11 and 12, the input voltage $V_{in}$ applied to the gate electrode regions 119 and 120 is compared with the control voltage $V_h$ applied to the control gate electrode regions 121 and 122. If the control voltage is less than the input voltage ($V_h<V_{in}$) the output voltage $V_{out}$ becomes substantially zero. On the other hand, if the control voltage is greater than the input voltage ($V_h>V_{in}$) the output voltage $V_{out}$ becomes substantially equal to the supply voltage $V_{dd}$.

Figure 15:
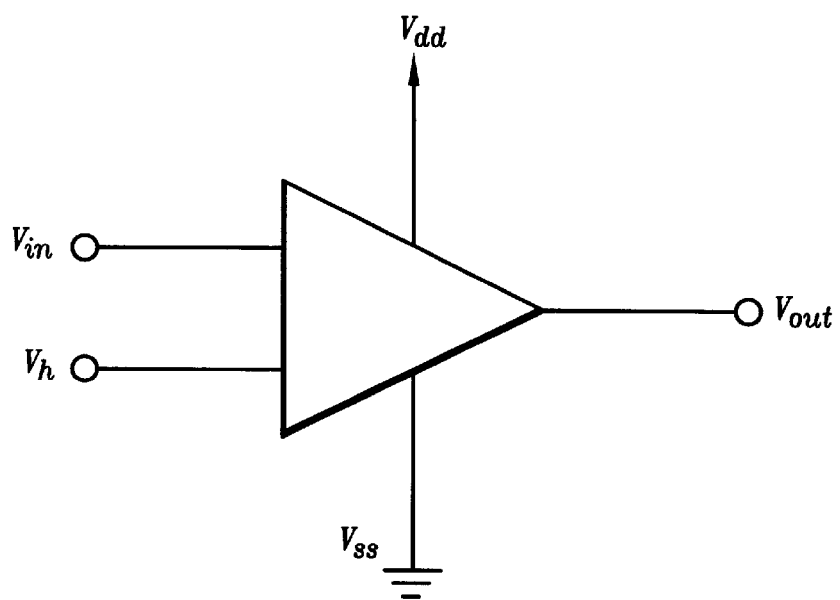
FIG. 15 is a schematic diagram of a comparator constructed using the semiconductor devices according to the invention.
Figure 16:
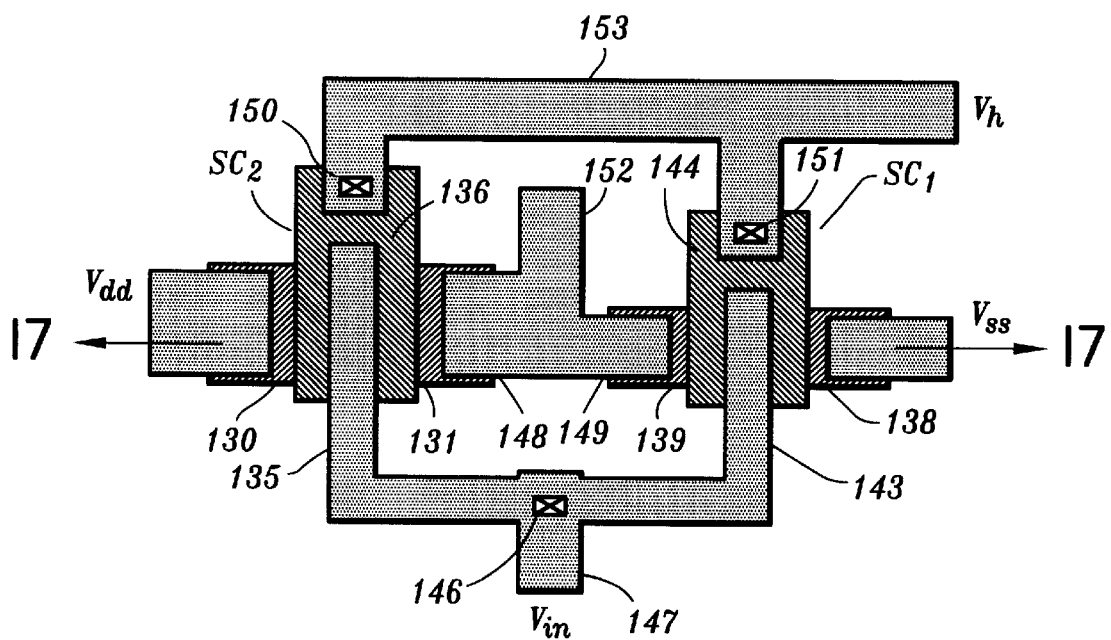
FIG. 16 is a schematic diagram illustrating the layout of the comparator constructed with the semiconductor devices of the invention.
Figure 17:
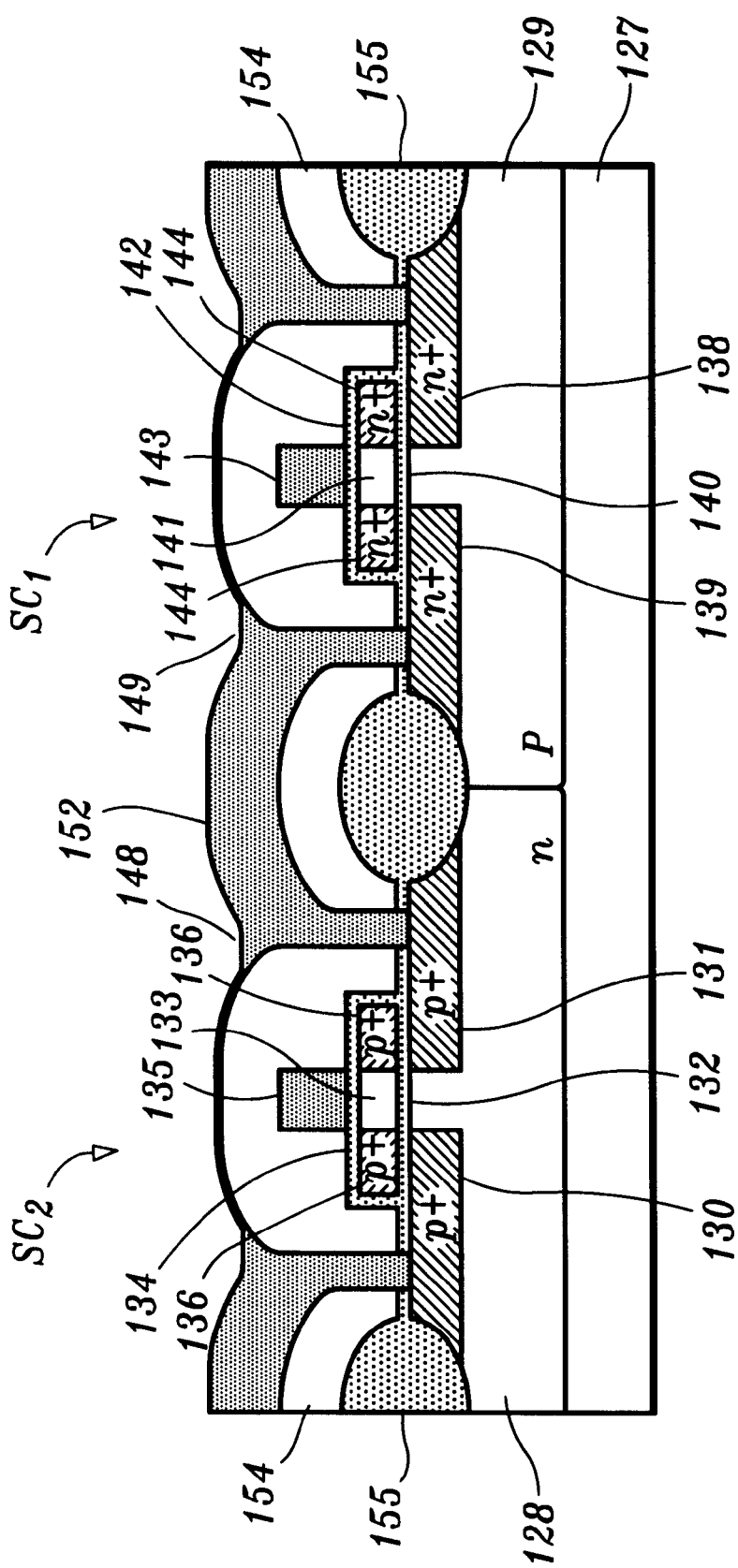
FIG. 17 is a schematic diagram illustrating the structure of the comparator constructed with the semiconductor devices of the invention.

This operational characteristic permits the complementary inverter circuit to be used as a comparator which is shown in FIG. 15. That is, the inverter shown of FIG. 11 can operate as a comparator if the gate electrode regions 110 and 120 are used as the input terminal, and the control gate electrode regions 121 and 122 are used as the reference voltage input terminal, and the drain electrode regions 111 and 112 are used as the output terminal. FIGS. 16 and 17 illustrate an exemplary embodiment of the layout and structure for such a comparator circuit. In this embodiment, the comparator includes an n-type silicon substrate 127, an n-well 128 formed by implanting phosphorus ions into the substrate 127, a p-well 129 formed by implanting boron ions into the substrate 127, a p-channel device SC2 formed in the n-well 128, and an n-channel device SC1 formed in the p-well 129. The p-channel device SC2 of the comparator has a source electrode region 130 and a drain electrode region 131 each formed by diffusing p-type impurities into the n-well 128 to a high concentration level. A silicon oxide film serving as a first gate insulating film 132, a thin polycrystalline silicon film serving as an n-type semiconductor region 133, a silicon oxide film serving as a second gate insulating film 134, and an $n^+$-polysilicon electrode region serving as a gate electrode region 135 are formed successively on the n-well 128, as seen in FIG. 17. Polysilicon electrode regions of $p^+$-type serving as control gate electrode regions 136 are formed in contact with the semiconductor region 133 and disposed between the first and second gate insulating films 132 and 134.

The n-channel device $SC_1$ of the comparator has a source electrode region 138 and a drain electrode region 139 each formed by diffusing n-type impurities into the p-well 129 to a high concentration level. A silicon oxide film serving as a first gate insulating film 140, a thin polycrystalline silicon film serving as a p-type semiconductor region 141, a silicon oxide film serving as a second gate insulating film 142, and an $n^+$-polysilicon electrode region serving as a gate electrode region 143 are formed successively on the p-well 129, as seen in FIG. 17. Polysilicon electrode regions of $n^+$type serving as control gate electrode regions 144 are formed in contact with the semiconductor region 141 and disposed between the gate insulating films 140 and 142. The comparator circuit structure also includes interlayer insulating films 154 and field oxide films 155 for isolation.

The gate electrodes 135 and 143 of each device $SC_1$ and $SC_2$ respectively are connected to a common to an aluminum interconnection 147 via a contact hole 146 so that the gate electrode regions 135 and 143 act as a signal input terminal $V_{in}$, as seen in FIG. 16. The drain electrode region 131 of the p-channel device SC2 and the drain electrode region 139 of the n-channel device SCI are connected to a common aluminum interconnection 152 via contact holes 148 and 149 so that the drain electrode regions 131 and 139 act as an output terminal $V_{out}$, as seen in FIG. 16. The control gate electrode regions 136 of the p-channel device SC2 and the control gate electrode regions 144 of the n-channel device SC1 are connected to a common aluminum interconnection 153 via contact holes 150 and 151 so that the control gate electrode regions 136 and 144 act as a reference voltage input terminal $V_h$, as seen in FIG. 160.

An exemplary production flow diagram of the comparator according to the present invention is shown in FIG.

Figure 18A:
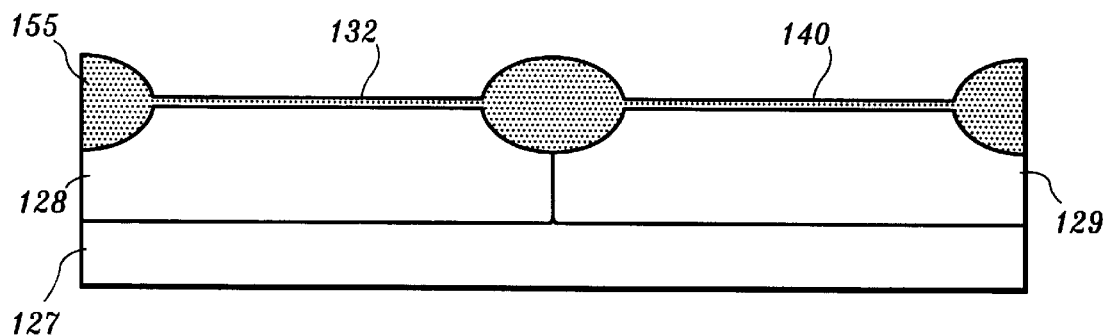
FIGS. 18a–18e are production flow diagrams for fabricating the comparator according to the invention.

18a–18e. Referring to FIG. 18a, the n-well 128 is formed by implanting phosphorus ions into the n-pe silicon substrate 127 and the p-well 129 is formed by implanting boron ions into the substrate 127. The field oxide films 155 are then formed on the n-well and p-well using the LOCOS technique to isolate an area on the surface of the substrate and form active regions. The gate insulating films 132 and 140 of silicon oxide having a thickness of about 10 nm are formed on the surface of the above isolated areas of the substrate using the dry oxidation technique performed at a temperature that is preferably lower than 900° C. Phosphorus ions are then implanted through the gate insulating film 132 and boron ions are implanted through the gate insulating film 140 so that the surfaces of the n-well 128 and the p-well 129 are doped with a proper concentration of impurities to adjust the threshold voltage of the channel regions.

Figure 18B:
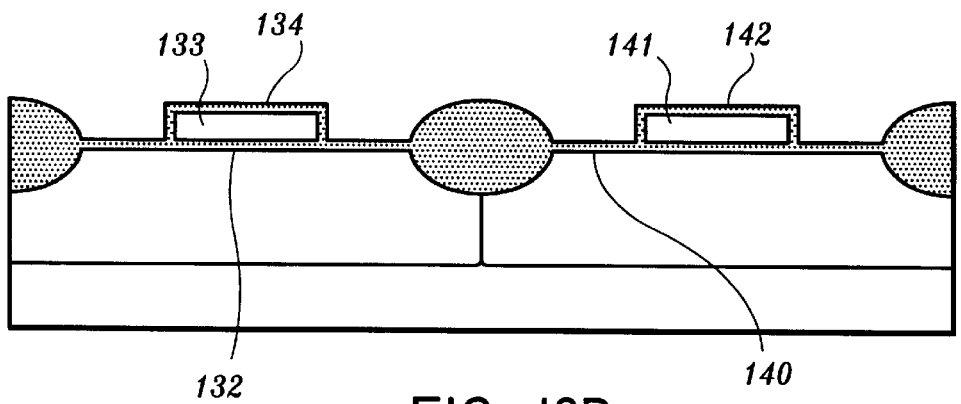

Referring to FIG. 18b, the semiconductor regions 133 and 141 of polycrystalline silicon each with a thickness of about 30 nm are formed on the gate insulating films 132 and 140, respectively, using the LPCVD technique. The semiconductor regions 133 and 141 of polycrystalline silicon are formed at a substrate temperature of about 630° C., a pressure of about 0.1 Torr, and at an $SiH_4$ gas flow rate of about 200 SCCM, and then patterned into a predetermined form.

After the semiconductor regions are patterned, the second gate insulating films 134 and 142 of silicon oxide having a thickness of about 10 nm are formed using the LPCVD technique at a substrate temperature of about 800° C., a pressure of about 0.9 Torr, an $SiH_4$ gas flow rate of about 30 SCCM, and an $N_2O$ gas flow rate of about 100 SCCM. Phosphorus ions are then implanted into the semiconductor region 133 through the gate insulating film 134 to adjust the impurity concentration in the semiconductor region 133. Similarly, boron ions are implanted into the semiconductor region 141 through the gate insulating film 142 to adjust the impurity concentration in the semiconductor region 141.

The semiconductor regions are implanted with impurities at the predefined concentration levels to ensure effective control of the drain current flowing between the source and the drain electrode regions of the n-channel and p-channel devices by the control gate electrode regions.

Figure 18C:
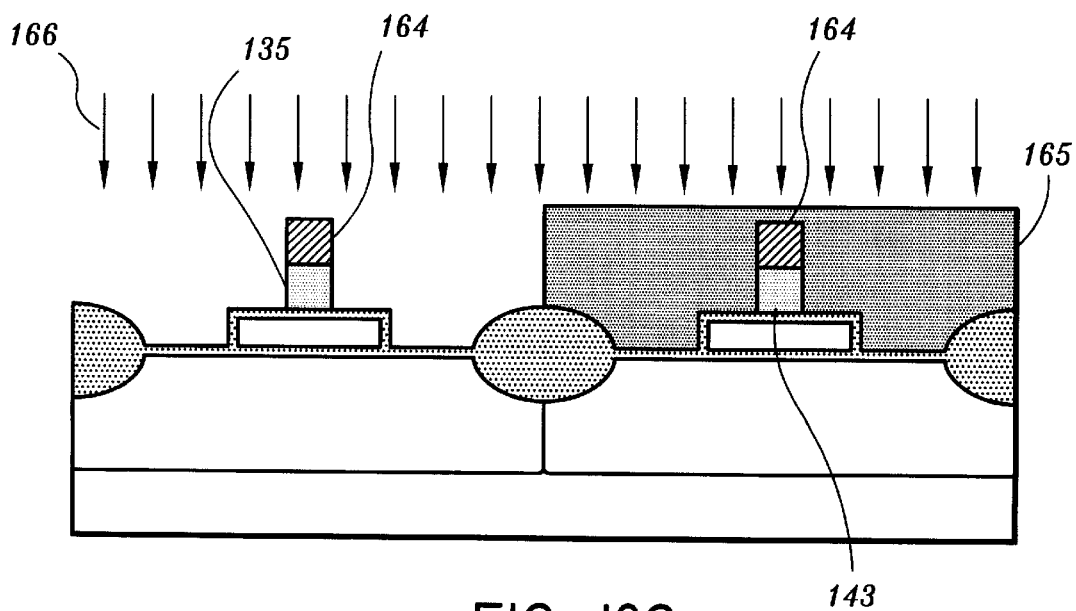

Referring to FIG. 18c, gate electrode regions 135 and 143 of phosphorus-doped polysilicon having a thickness of about 300 nm are formed using the LPCVD technique, and patterned into a predetermined form using resist 164 as a mask. The gate electrodes regions 135 and 143 are formed at a substrate temperature of about 500° C., a pressure of about 0.9 Torr, an $Si_2H_6$ gas flow rate of about 90 SCCM, a $PH_3$ gas flow rate of about 10 SCCM, and at an $N_2O$ gas flow rate of about 800 SCCM. After the gate electrodes regions are formed, a resist pattern 165 is formed in such a manner that the n-channel device region is covered with the resist pattern 165 while keeping the resist 164 exposed, as seen in FIG. 18c.

Boron ions 166 are then implanted into the substrate so as to form the source electrode region 130, the drain electrode region 131 and the control gate electrode regions 136 of the p-channel device SC2. As discussed above, the multiple step ion implantation process is performed using different implantation energy and dosage levels to form the source, drain and control gate electrode regions. For example, the first implantation step may be performed with a 2E15 $cm^{-2}$ dose of boron ions at 30 keV, and the second implantation step may be performed with a 4E15 $cm^{-2}$ dose of boron ions at 45 keV. This multiple step implantation process makes it possible to simultaneously form the source, drain and the control gate electrode regions of the p-channel device in the self-alignment fashion. That is, during the low-energy ion implantation step, impurity ions are implanted into the control gate electrode regions and during the high energy ion implantation step, impurity ions are implanted into the source and drain electrode regions.

Figure 18D:
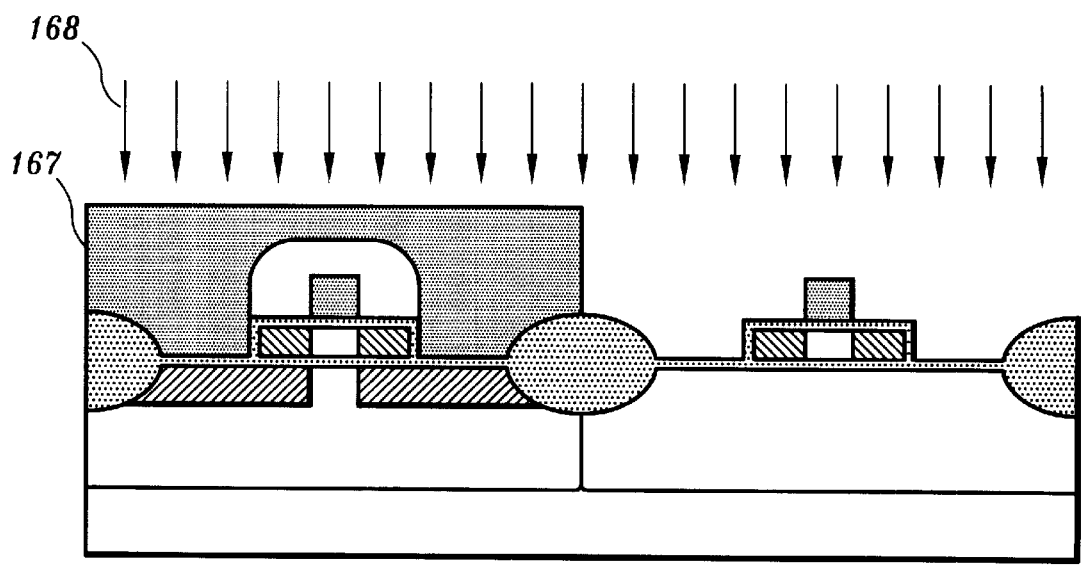

After the source, drain and control gate electrode regions are formed in the device SC2, the resist patterns 164 and 165 are removed, and a resist pattern 167 is then formed in such a manner that the p-channel device SC2 area is covered with the resist pattern 167, as seen in FIG. 18d. Phosphorus ions 168 are then implanted so as to form the source electrode region 138, the drain electrode region 139 and the control gate electrode regions 144 of the n-channel device SCI. The phosphorus ions are also implanted using the multiple implantation process. For example, the first implantation step may be performed with a 2E15 $cm^2$ dose of phosphorous ions at about 30 keV, and the second implantation step may be performed with a 5E15 $cm^2$ dose of phosphorous ions at about 90 keV. Thus, as in the p-channel device, the n-channel device is formed in the self-alignment fashion.

Figure 18E:
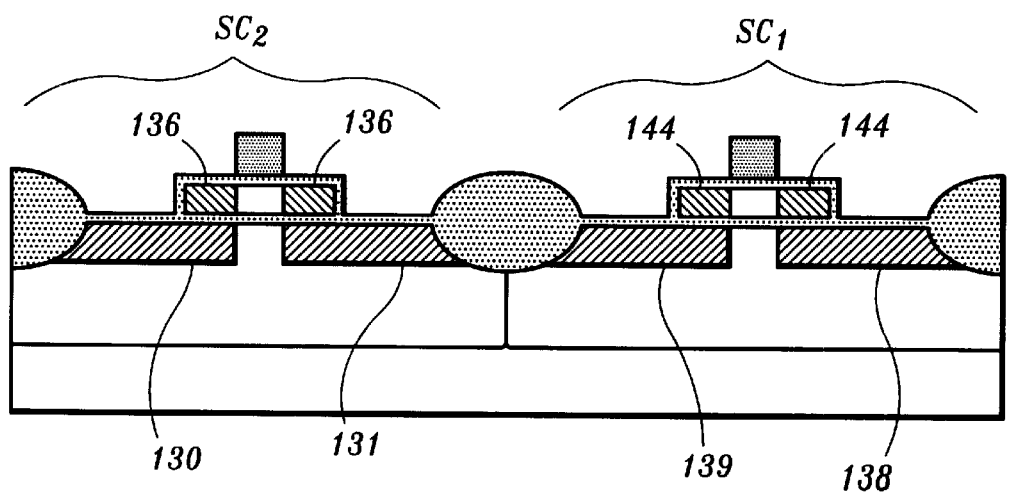

After the multiple step ion implantation process, the resist pattern 167 is removed and the implanted impurities are activated so that the source, drain and control gate electrode regions of each device SC1 and SC2 are finally formed and thus the basic structure of the comparator according to the invention is obtained, as seen in FIG. 18e.

Further processes including deposition of an interlayer insulating film, formation of contact holes, formation of aluminum electrode interconnections, and metalization are performed to complete fabrication of the comparator according to the present invention. Thus, as described above the comparator circuit of the present invention can be fabricated using common silicon fabrication production machinery and processes without having to employ additional costly machinery and processes.

The n-channel device of the comparator fabricated in the above-described manner has drain characteristics similar to that shown in FIG. 8 for the semiconductor device of the present invention when, for example, the channel length L is 2 mm, the channel width W is 4 mm, the channel region CH in the silicon substrate is doped with a 1E17 $cm^{-3}$ dose of p-type impurity, the semiconductor region of polycrystalline silicon is doped with a 1E16 $cm^{-3}$ dose of p-type impurity, and the gate and control gate electrodes are of $n^+$-type polysilicon. As a result, the drain saturation current $I_{dsat}$ is controlled by the control voltage $V_h$ applied to the control gate electrode.

Figure 19:
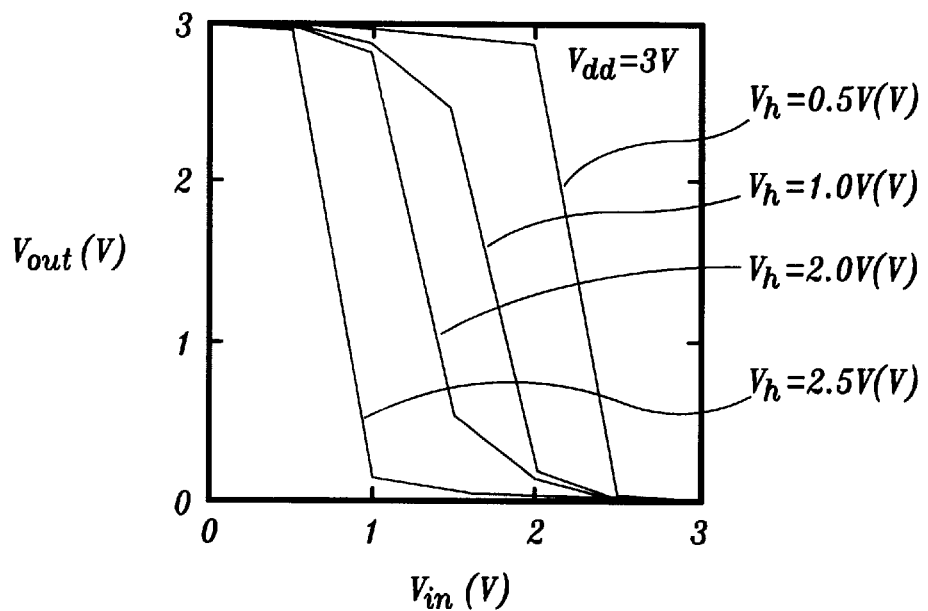
FIG. 19 is a graph illustrating input-output characteristic of the comparator shown in FIGS. 16 and 17.
Figure 20:
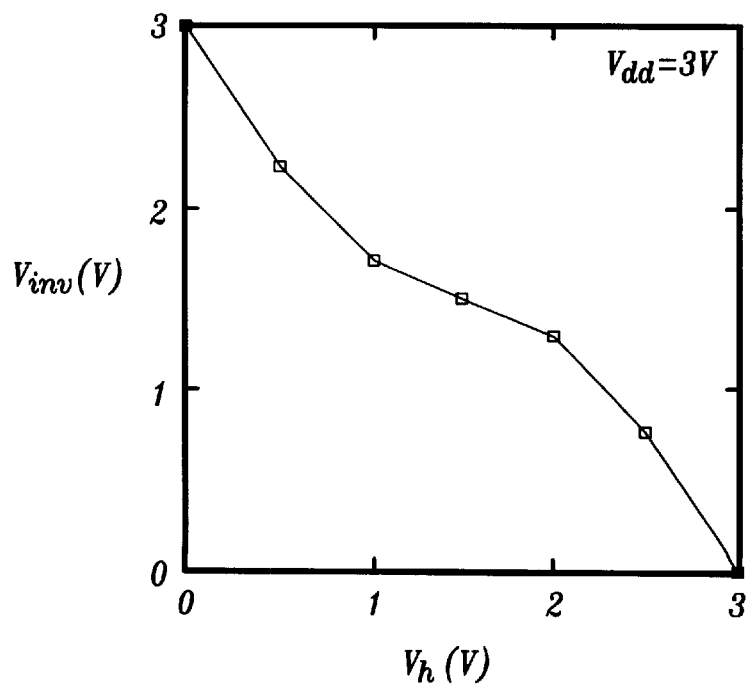
FIG. 20 is a graph illustrating a relationship between a logical inverting voltage and a voltage applied to a control gate of the comparator shown in FIGS. 16 and 17.

FIG. 19 is a graph illustrating input-output characteristics of the comparator circuit constructed with the semiconductor devices of the present invention wherein a supply voltage $V_{dd}$ of 3 volts is applied to the comparator circuit. FIG. 20 is a graph illustrating a relationship between the logical inverting voltage $V_{inv}$ of the comparator circuit and the control voltage $V_h$ applied to the control gate electrode regions. As can be seen from FIGS. 19 and 20, the logical inverting voltage of the comparator circuit is controlled by varying the control voltage $V_h$ applied to the control gate electrode regions. As seen in FIG. 20, as the control voltage increases the logical inverting voltage (the switching threshold voltage) decreases.

The comparator circuit described above can be used in various configurations to form various integrated circuits that perform various functions. For example, the comparator circuit can be used in highly accurate, high speed analog-to-digital (A/D) converter circuits 74, sometimes known as flash A/D converters. The A/D converter circuits of the present invention overcome the above-identified drawbacks of current A/D converters.

Figure 21:
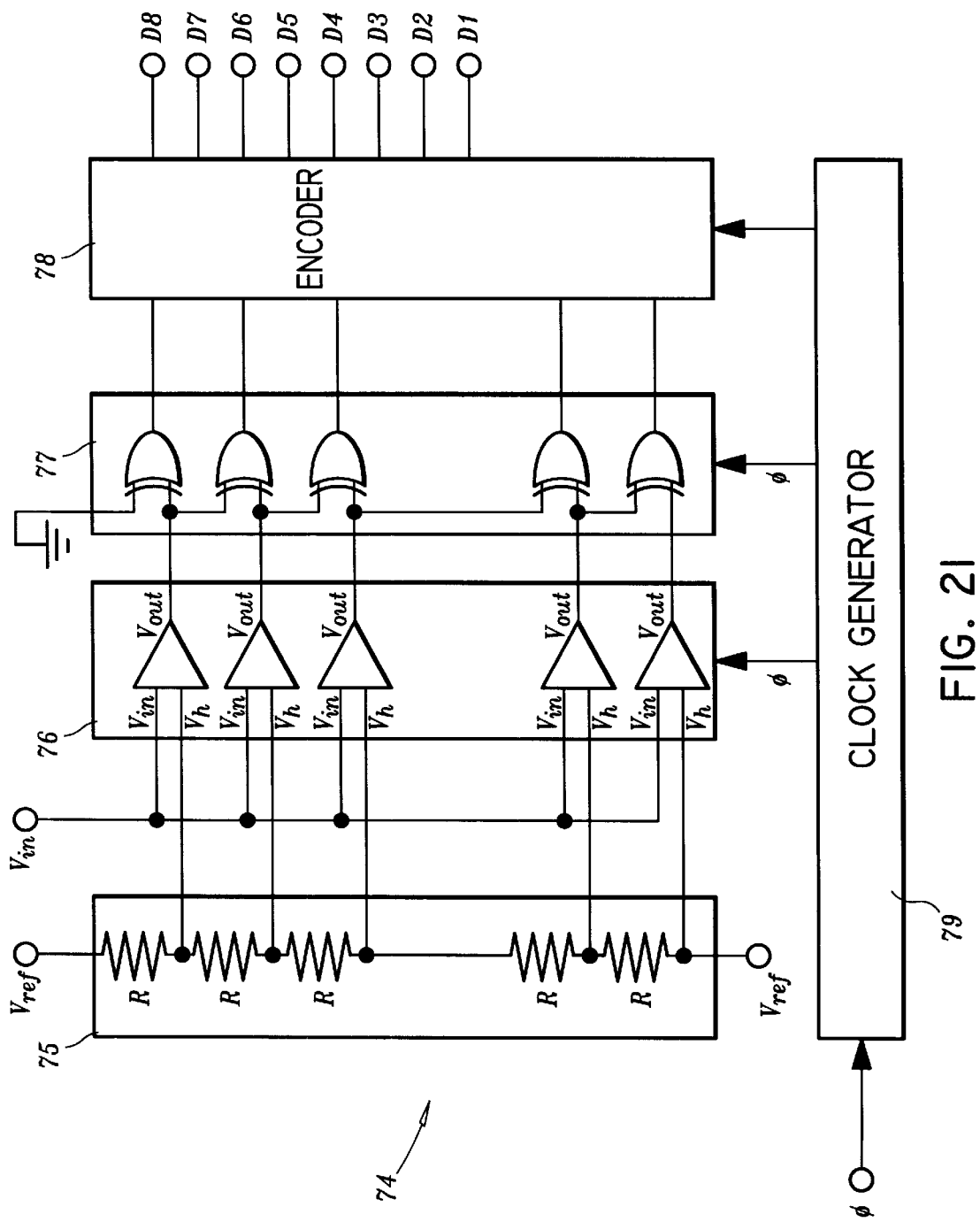
FIG. 21 is a circuit diagram illustrating a circuit configuration of a flash A/D converter circuit constructed using comparator circuits constructed according to the invention.

FIG. 21 illustrates an exemplary embodiment of an 8-bit A/D converter constructed with the comparators shown in FIGS. 15–17 and described above. The A/D converter 74 includes a series of resistors 75, a series of comparators 76 constructed with the semiconductor devices of the present invention, a differentiating circuit 77 composed of a series of exclusive OR gates, an encoder 78 for converting input signals into binary digital signals, and a clock generator 79. The A/D converter 74 has operational parameters similar to conventional A/D converters but includes the comparators described above.

The semiconductor devices and associated circuits described above provide the capability of controlling the drain saturation current of each semiconductor device used with a very simple structure having four terminals. This semiconductor device according to the present invention has operational characteristics similar to those of conventional MOS transistors and can be constructed in either form n-type or p-type and complementary to each other making it possible to construct various circuits using a smaller number of semiconductor devices than would be used in conventional MOS and CMOS circuits.

In addition, the semiconductor device and associates circuits of the present invention can be fabricated using known integrated circuit processing techniques. For example, the process and device parameters such as the impurity concentration, silicon film thickness, oxide film thickness, and gate length are all within the ranges which can be easily controlled by conventional technology.

Figure 22:
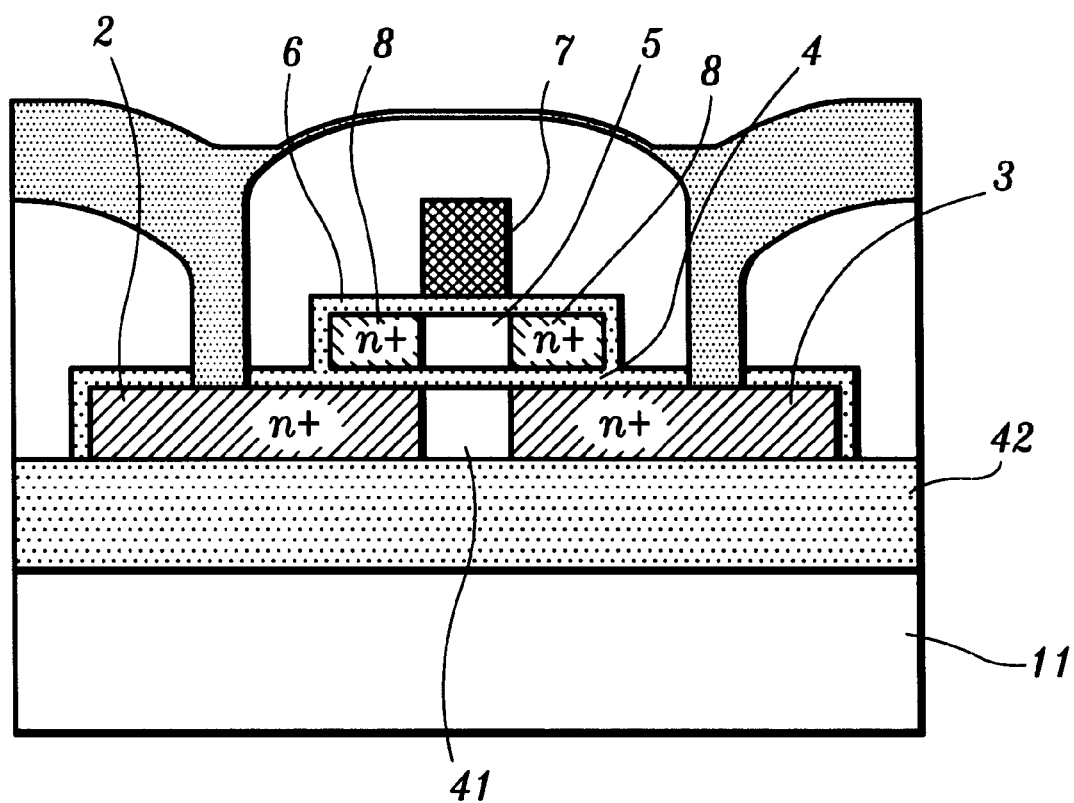
FIG. 22 is a schematic diagram of an alternative embodiment of the semiconductor device shown in FIG. 6.

In the embodiments described above, a silicon wafer is employed as the substrate of the semiconductor device. In alternative embodiments, a silicon on insulator (SOI) wafer may be employed as the substrate material. FIG. 22 is a schematic diagram of an alternative embodiment of the semiconductor device shown in FIG. 6. In this embodiment, an SOI wafer is employed as the substrate and includes a silicon substrate 11, an oxide insulating film 42, and a thin silicon film 41 formed on the insulating film 42. Preferably, the oxide film 42 has a thickness of about 2 mm, and the high-resistivity ptype silicon layer 41 has a thickness of about 100 nm. Device isolation is realized by patterning the high-resistivity silicon layer 41 into islands. The semiconductor device constructed according to this embodiment includes the SOI wafer, and the semiconductor region 5 of thin polycrystalline silicon disposed between the two gate oxide films 4 and 6. The semiconductor region is formed by crystallizing a thin film of amorphous silicon by a solid phase growth process. The remaining regions of the semiconductor device of this embodiment are the same as those discussed above with reference to FIG. 6.

Using the SOI wafer provides a significant reduction in parasitic capacitance in the semiconductor devices or associated circuits so as to improve the operational speed of the devices and circuits fabricated therefrom and reduces the power consumption of such devices. The reduction is parasitic capacitance also suppresses short channel effects. As a result, a significant improvement in circuit performance can be achieved.

The thin amorphous silicon film used to obtain the semiconductor region 5 can be formed either by means of LPCVD in which a low deposition temperate results in growth of the amorphous film, or by means of ion implantation in which the thin silicon film is converted into an amorphous form. If the LPCVD technique is used, the film may be formed for example at a substrate temperature of about 500° C., a pressure of about 0.1 Torr, and at an $Si_2H_6$ gas flow rate of about 200 SCCM. If the ion implantation technique is used, the implantation may be performed for example with a 1.0E17 $cm^{-2}$ ion dose at 30 KeV.

The thin amorphous silicon film obtained in this way is placed in an anneal furnace and subjected to a solid phase growth process thereby converting the amorphous silicon film to a polycrystalline silicon film. The solid phase growth process for the thin amorphous silicon film may be performed for example in an $N_2$ gas ambient at a substrate temperature of about 600° C. for 60 hours. The semiconductor region 5 obtained via the solid phase growth process has a grain size ranging from between a few hundred nanometers and a few millimeters which is significantly larger when compared to the grain size in films formed by standard growth technology which is of the order of a few tens of nanometers. As a result of the solid phase growth process, the depletion layer in the semiconductor region 5 has a higher sensitivity to the voltage applied to the control gate electrode regions 8 so that it is possible to more accurately control the drain current.

As described above, the performance of the semiconductor device according to the present invention can be further improved by employing the SOI as the semiconductor substrate, and/or by improving the film quality of the thin polycrystalline silicon film 8 disposed between the two gate insulating films 4 and 6.

Figure 23:
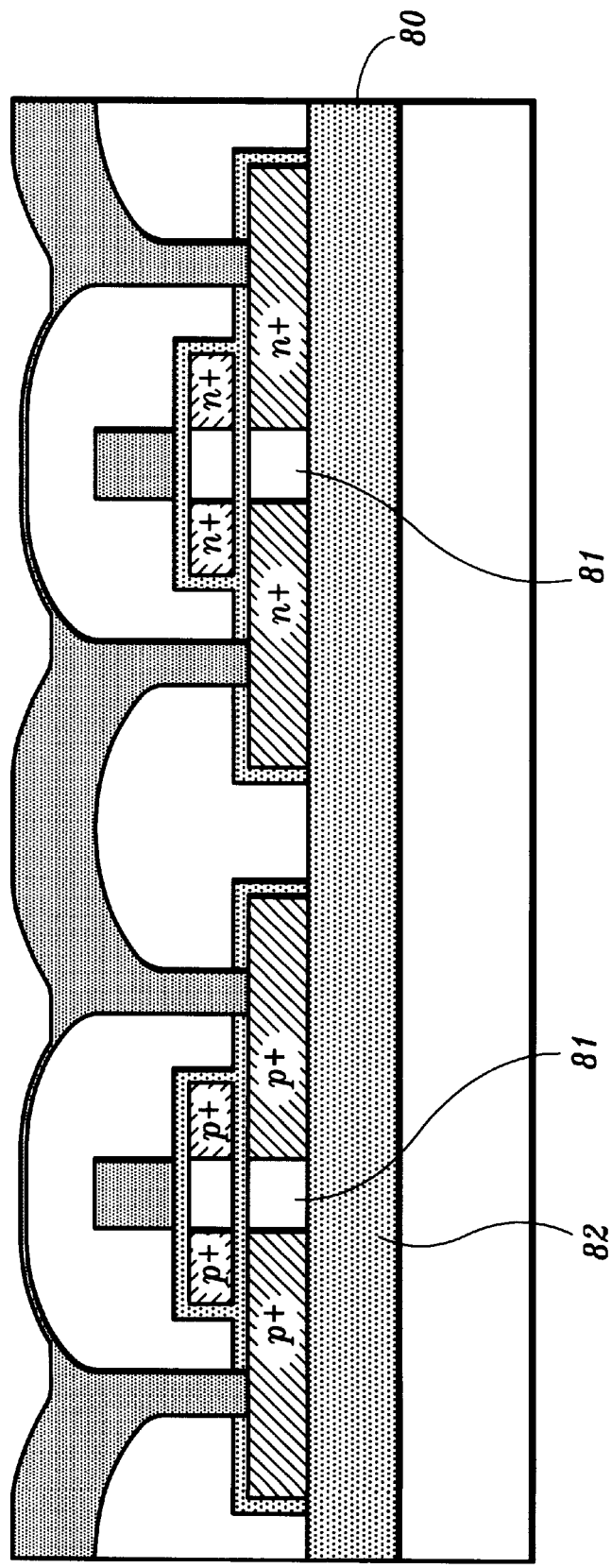
FIG. 23 is a schematic diagram illustrating an alternative embodiment of the comparator circuit shown in FIGS. 16 and 17.
Figure 24:
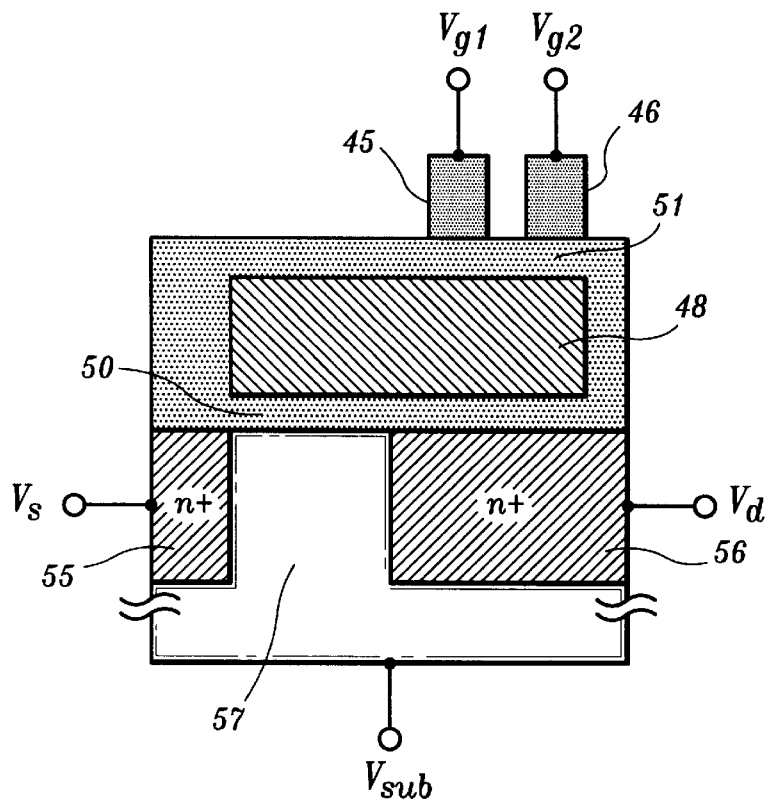
FIG. 24 is a schematic diagram of a conventional vMOS transistor.
Figure 25:
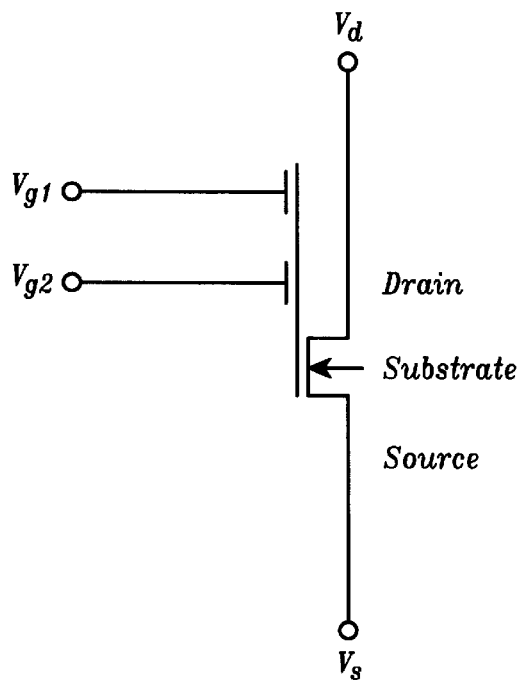
FIG. 25 is a circuit diagram of the vMOS transistor shown in FIG. 24.
Figure 26:
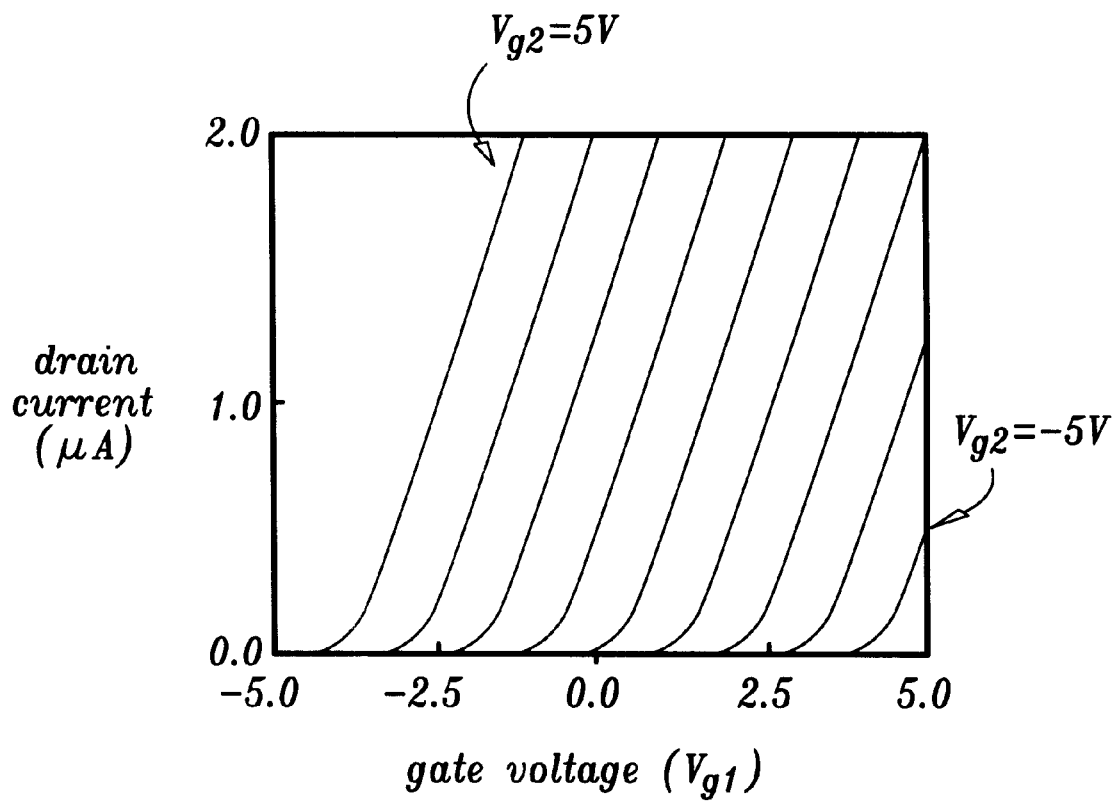
FIG. 26 is a graph illustrating a relationship between a drain current and a gate voltage of the vMOS transistor shown in FIG. 25.
Figure 27A:
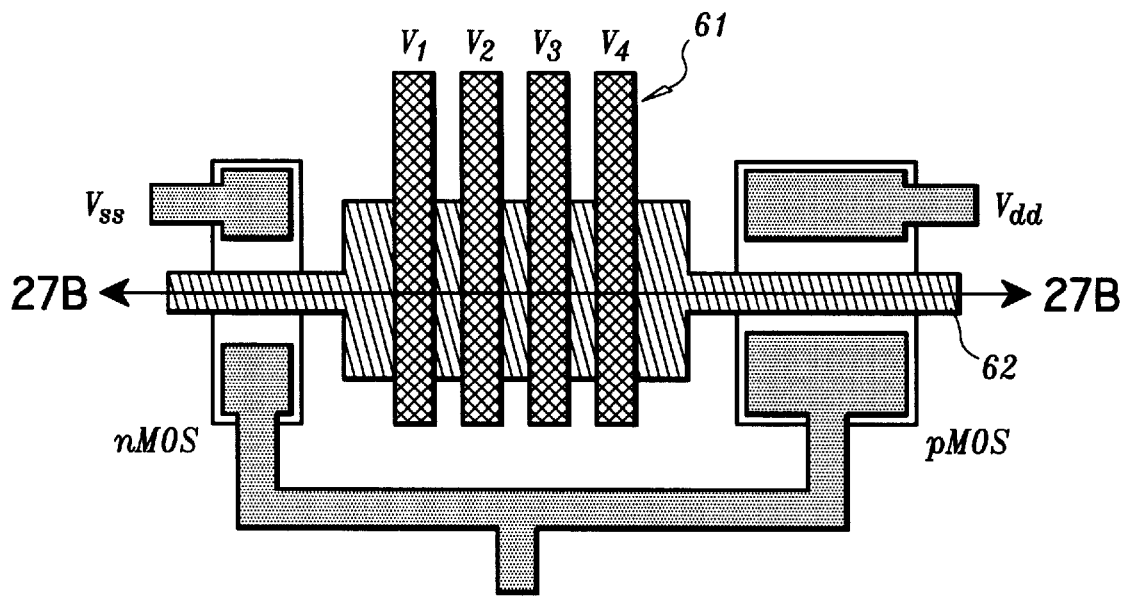
FIGS. 27a and 27b are schematic diagrams of an inverter constructed in a CMOS fashion with conventional vMOS transistors.
Figure 27B:
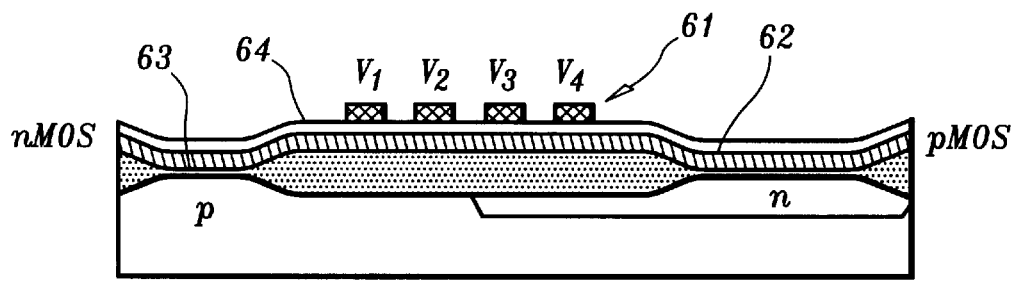
Figure 28:
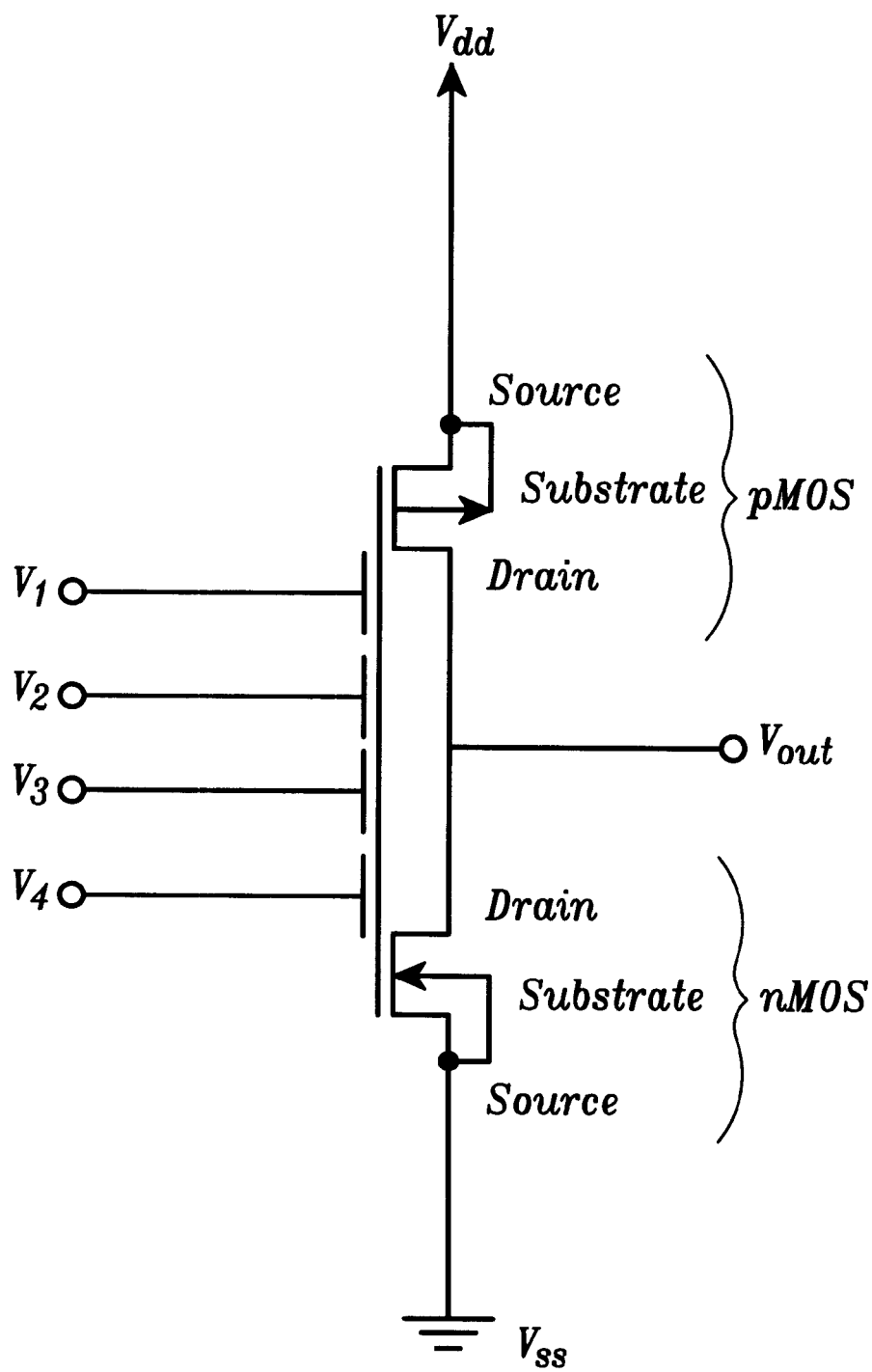
FIG. 28 is a circuit diagram of the inverter of FIGS. 27a and 27b.
Figure 29:
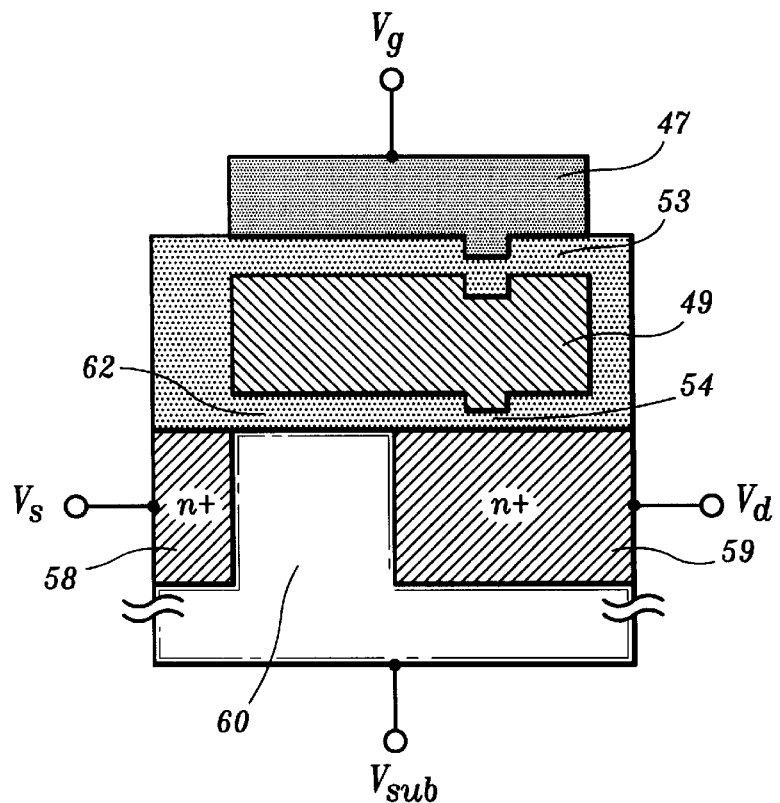
FIG. 29 is a schematic diagram of a conventional EEPROM fabricated using vMOS transistors.
Figure 30:
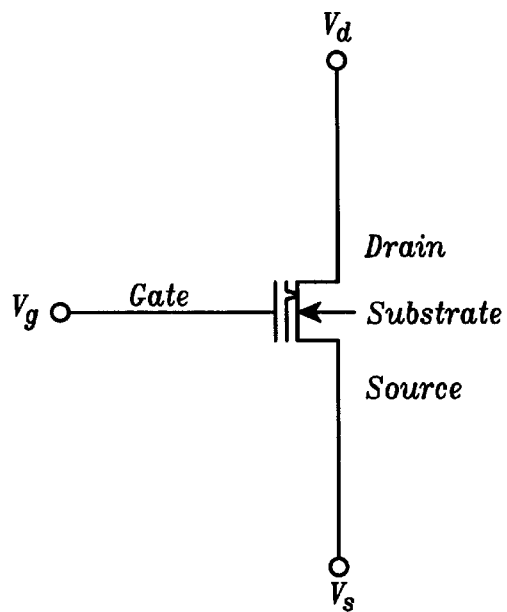
FIG. 30 is a circuit diagram of the EEPROM shown in FIG. 29.
Figure 31:
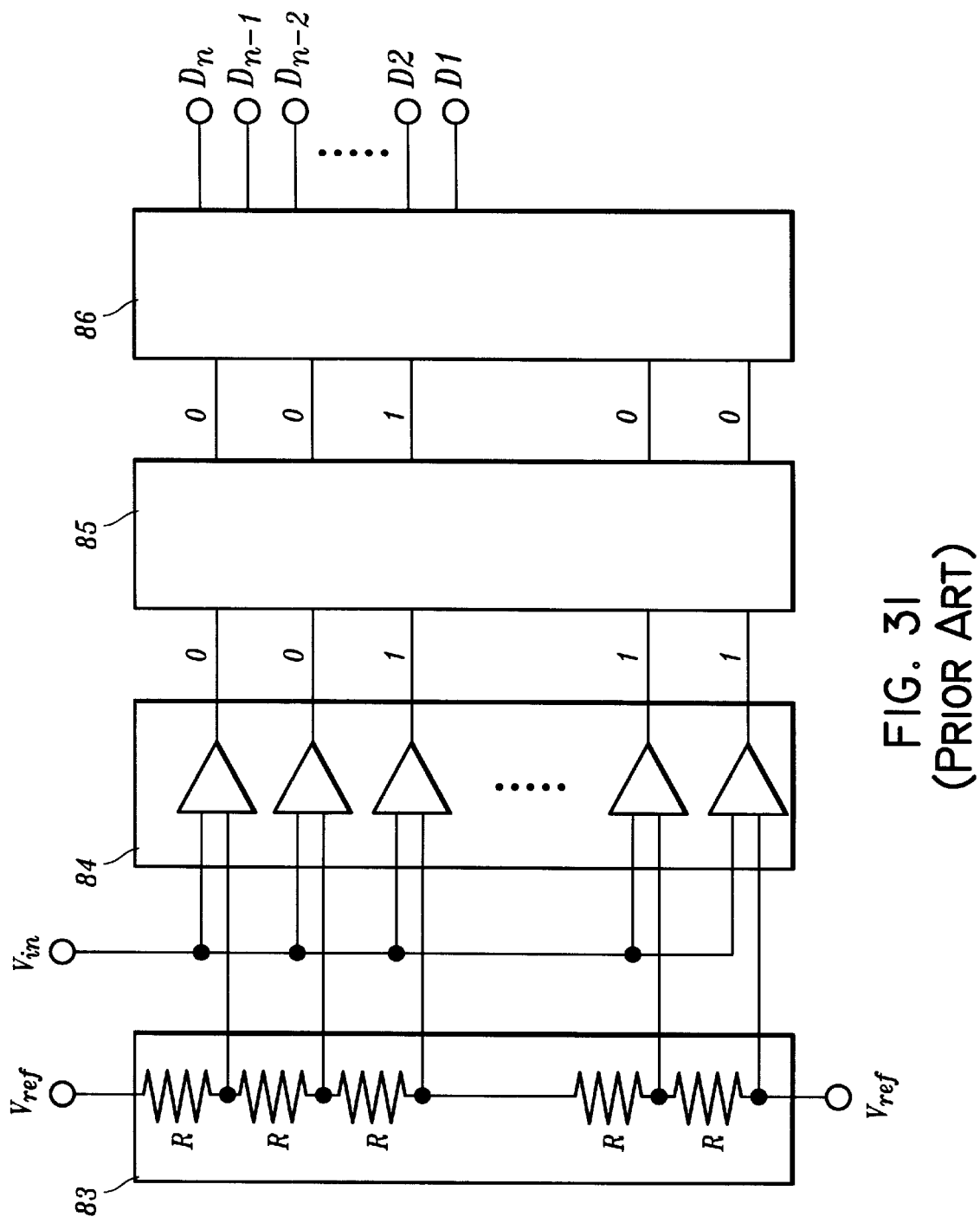
FIG. 31 is a circuit diagram of a conventional n-bit flash A/D converter.
Figure 32:
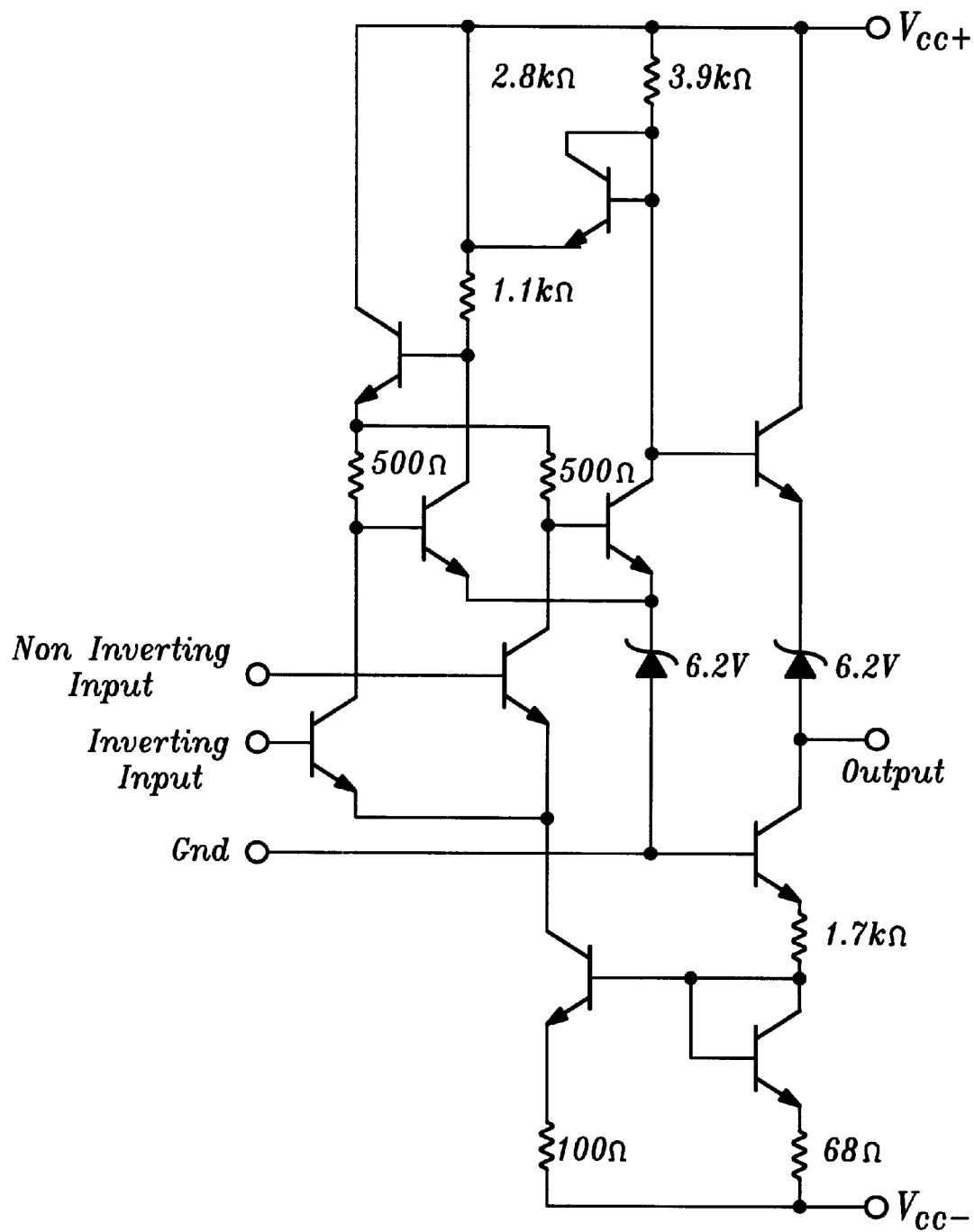
FIG. 32 is a circuit diagram of a conventional comparator used in a conventional flash A/D converter.
Figure 33:
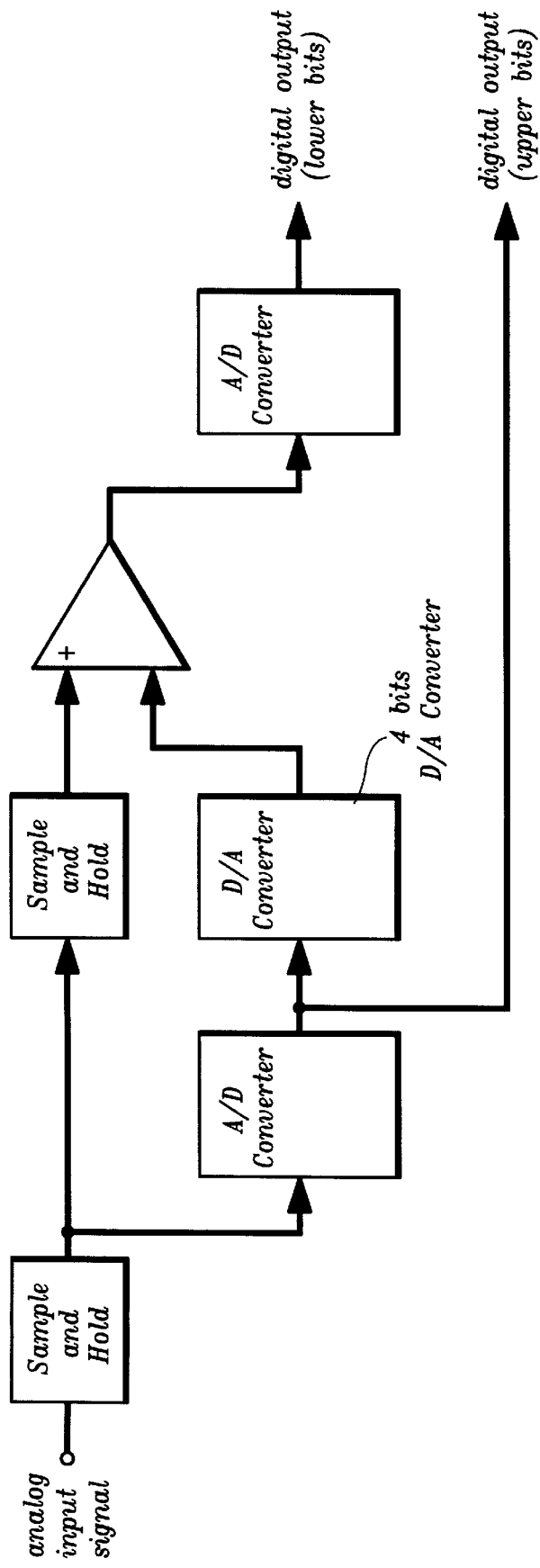
FIG. 33 is a circuit diagram of another circuit configuration of a conventional flash A/D converter.
Figure 34:
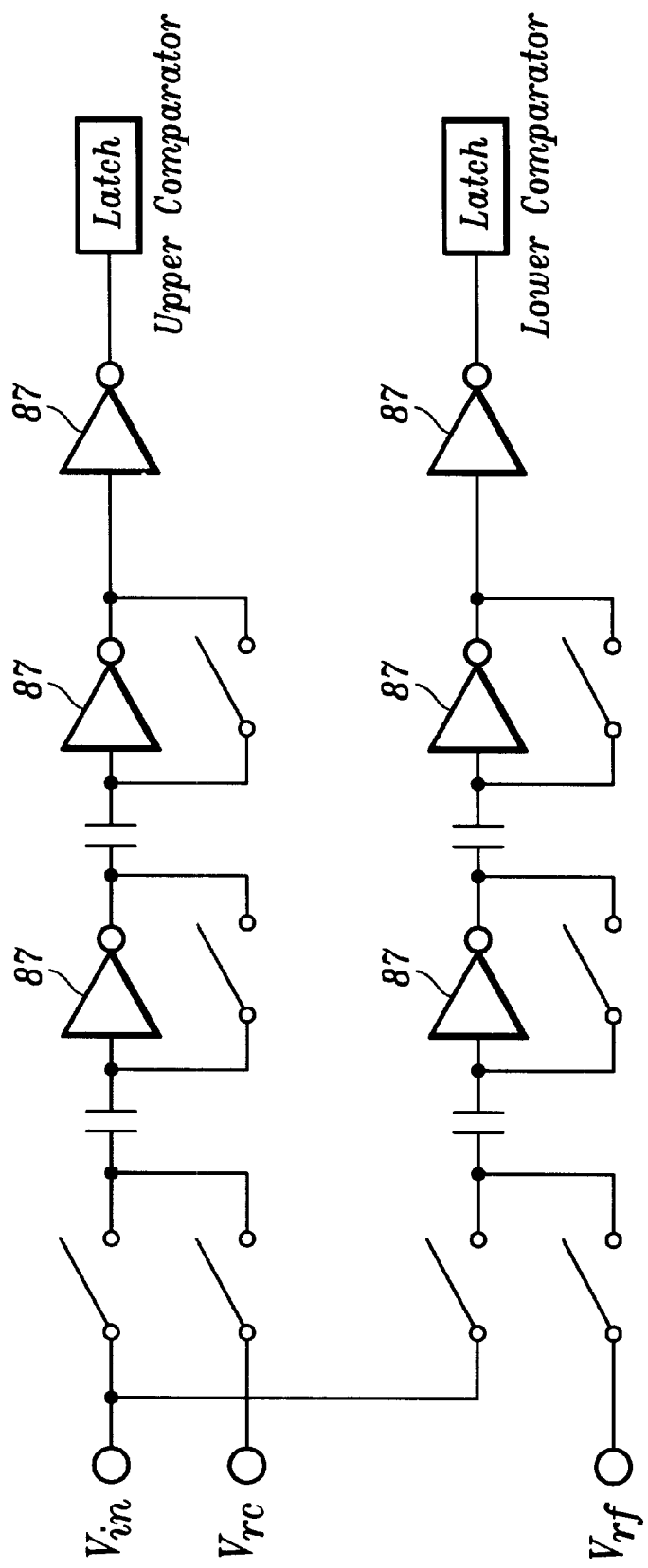
FIG. 34 is a circuit diagram of another circuit configuration of a conventional flash A/D converter.

FIG. 23 is a cross-sectional view of a comparator constructed with the semiconductor device shown in FIG. 22. The comparator shown in FIG. 23 has substantially the same structure as the comparator shown in FIGS. 16 and 17 except that the substrate consists of a silicon on insulator (SOI) wafer. In the comparator shown in FIG. 23, the SOI wafer 80 includes a p-type high-resistivity silicon layer 81 having a thickness of about 100 nm formed on an underlying oxide layer 82 having a thickness of about 2 mm. Device isolation is realized by patterning the silicon layer 81 into islands. In this embodiment, the SOI wafer achieves a substantial reduction in the parasitic capacitance associated with semiconductor devices and associated circuits and also suppresses the short channel effects, as noted above. Since device isolation can be achieved by a simple process including a smaller number of steps, and this comparator circuit is suitable for high integration.

It will be understood that various modifications can be made to the embodiments of the present invention herein without departing from the spirit and scope thereof. For example, various circuits may be fabricated using the semiconductor device of the present invention in addition to those discussed hereinabove. Further, various circuit fabrication techniques may be used to fabricate the semiconductor device and associated circuits. Therefore, the above description should not be construed as limiting the invention, but merely as preferred embodiments thereof. Those skilled in the art will envision other modifications within the scope and spirit of the invention as defined by the claims appended hereto.

What is claimed is:

1. A comparator comprising an inverter having at least two semiconductor devices with conduction types opposite to each other and formed in a complementary fashion on a substrate, each of said at least two semiconductor devices comprising:

a substrate;

a source electrode region and a drain electrode region formed in said substrate;

a first gate insulating film formed on said substrate, a semiconductor region formed on said first gate insulating film;

a second gate insulating film formed on said semiconductor region;

a gate electrode region formed on said second gate insulating film; and a pair of semiconductor electrode regions sandwiching said semiconductor region and forming control electrodes disposed in contact with said semiconductor region.

2. The comparator according to claim 1, wherein an input signal voltage is applied to said gate electrode regions of said semiconductor devices, and a reference voltage is applied to said at least one control electrode regions disposed in contact with said semiconductor region of said semiconductor devices.

3. The comparator according to claim 1, wherein said substrate in each of said semiconductor devices is a thin silicon film formed on an insulating film.

* * * * *

UNITED STATES PATENT AND TRADEMARK OFFICE
CERTIFICATE OF CORRECTION

PATENT NO. : 6,218,703 B1                                               Page 1 of 1
DATED      : April 17, 2001
INVENTOR(S) : Yutaka Sano It is certified that error appears in the above-identified patent and that said Letters Patent is hereby corrected as shown below:

<u>Title page,</u>
Item [54], please change the title from "SEMICONDUCTOR DEVICE WITH CONTROL ELECTRODES FORMED FROM SEMICONDUCTOR MATERIAL" to -- SEMICONDUCTOR DEVICE WITH CONTROL ELECTRODES --.

Signed and Sealed this

Sixteenth Day of October, 2001

Attest:

NICHOLAS P. GODICI
*Attesting Officer*   *Acting Director of the United States Patent and Trademark Office*